(12) United States Patent
Murashige et al.

(10) Patent No.: US 10,529,743 B2
(45) Date of Patent: Jan. 7, 2020

(54) ACTIVE MATRIX SUBSTRATE, DISPLAY DEVICE, AND MANUFACTURING METHOD

(71) Applicant: SHARP KABUSHIKI KAISHA, Sakai, Osaka (JP)

(72) Inventors: Shogo Murashige, Sakai (JP); Izumi Ishida, Sakai (JP); Tomohiro Kosaka, Sakai (JP); Tohru Okabe, Sakai (JP); Takeshi Hara, Sakai (JP); Hirohiko Nishiki, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 38 days.

(21) Appl. No.: 15/743,083

(22) PCT Filed: Jul. 7, 2016

(86) PCT No.: PCT/JP2016/070137
§ 371 (c)(1),
(2) Date: Jan. 9, 2018

(87) PCT Pub. No.: WO2017/006994
PCT Pub. Date: Jan. 12, 2017

(65) Prior Publication Data
US 2019/0081081 A1    Mar. 14, 2019

(30) Foreign Application Priority Data

Jul. 9, 2015   (JP) ................................ 2015-137642
Jul. 17, 2015  (JP) ................................ 2015-143449

(51) Int. Cl.
*H01L 27/12*     (2006.01)
*B81B 3/00*      (2006.01)
(Continued)

(52) U.S. Cl.
CPC ............ *H01L 27/1225* (2013.01); *B81B 3/00* (2013.01); *B81B 7/04* (2013.01); *G02B 26/02* (2013.01);
(Continued)

(58) Field of Classification Search
CPC combination set(s) only.
See application file for complete search history.

(56) References Cited

U.S. PATENT DOCUMENTS 5,986,729 A  *  11/1999  Yamanaka ............ G02F 1/1333
                                              349/153
6,473,072 B1 *  10/2002  Comiskey .............. B41J 3/4076
                                              345/107
(Continued)

FOREIGN PATENT DOCUMENTS

| CN | 104681568 A  | 6/2015 |
| JP | 2013-050720 A | 3/2013 |
| WO | 2007/075832 A2 | 7/2007 |

*Primary Examiner* — Van N Chow
(74) *Attorney, Agent, or Firm* — ScienBiziP, P.C.

(57) ABSTRACT

Disclosed is an active matrix substrate that includes a plurality of TFTs. The active matrix substrate 11 includes a substrate 100, TFTs, a light transmission film 204, and a protection film Cap4. The TFTs are provided on the substrate 100 so as to correspond to a plurality of pixels, respectively. The light transmission film 204 is provided between the TFTs and the substrate 100. The protection film Cap4 covers an end surface 204b of the light transmission film 204, the end surface 204b being not parallel with the substrate 100. The TFT includes a gate electrode, a gate insulating film, a semiconductor film, a drain electrode, and a source electrode. The protection film Cap4 is arranged between the light transmission film 204 and the semiconductor film of the TFT.

20 Claims, 23 Drawing Sheets

(51) Int. Cl.
*B81B 7/04* (2006.01)
*G02F 1/1368* (2006.01)
*G02B 26/02* (2006.01)
*H01L 51/50* (2006.01)
*H05B 33/10* (2006.01)
*H05B 33/22* (2006.01)
*H05B 33/24* (2006.01)
*H05B 33/26* (2006.01)
*G02F 1/1362* (2006.01)
*G09G 3/34* (2006.01)
*H01L 51/52* (2006.01)
*H01L 27/32* (2006.01)

(52) U.S. Cl.
CPC ...... *G02F 1/1368* (2013.01); *G02F 1/136286* (2013.01); *G09G 3/346* (2013.01); *G09G 3/3413* (2013.01); *H01L 27/1218* (2013.01); *H01L 27/3272* (2013.01); *H01L 27/3276* (2013.01); *H01L 51/50* (2013.01); *H01L 51/5246* (2013.01); *H01L 51/5253* (2013.01); *H05B 33/10* (2013.01); *H05B 33/22* (2013.01); *H05B 33/24* (2013.01); *H05B 33/26* (2013.01); *G09G 2310/0264* (2013.01)

(56) References Cited

U.S. PATENT DOCUMENTS

| | | | | |
|---|---|---|---|---|
| 7,236,151 | B2* | 6/2007 | Doane | G02F 1/133305 345/107 |
| 7,554,121 | B2* | 6/2009 | Hirakata | B82Y 10/00 257/79 |
| 2004/0080267 | A1* | 4/2004 | Cok | G06F 3/0412 313/512 |
| 2007/0103429 | A1* | 5/2007 | Takei | G02F 1/167 345/107 |
| 2007/0211036 | A1* | 9/2007 | Perkins | G06F 1/1615 345/173 |
| 2008/0291225 | A1* | 11/2008 | Arneson | G06F 3/011 345/698 |
| 2010/0317409 | A1* | 12/2010 | Jiang | G06F 1/1626 455/566 |
| 2011/0043479 | A1* | 2/2011 | van Aerle | G06F 1/1601 345/174 |
| 2011/0090207 | A1 | 4/2011 | Yamazaki et al. | |

* cited by examiner

ACTIVE MATRIX SUBSTRATE, DISPLAY DEVICE, AND MANUFACTURING METHOD

TECHNICAL FIELD

The present invention relates to an active matrix substrate that includes a plurality of thin film transistors, to a display device, and to a method for manufacturing an active matrix substrate.

BACKGROUND ART

A display device often includes an active matrix substrate that includes thin film transistors corresponding to a plurality of pixels, respectively. Examples of such a display device include a liquid crystal display, an organic EL display, and a microelectromechanical system (MEMS) display. The MEMS display is a display device in which mechanical shutters are used.

For example, Patent Document 1 indicated below discloses a transmission type MEMS display. In this MEMS display, on a first substrate that includes thin film transistors (also referred to as "TFTs"), a plurality of shutters of MEMS are arrayed in matrix so as to correspond to the pixels, respectively. On a light-shielding film laminated on a first-substrate-side surface of a second substrate, a plurality of openings are provided that are arrayed in matrix so as to correspond to the pixels, respectively. When the shutter portions move, the openings are opened/closed, which cause light from a backlight unit to be transmitted toward the display surface or to be blocked.

In recent years, oxide semiconductors having characteristics such as high mobility and low leakage current are used as semiconductor films for TFTs. The range of the use of the active matrix substrate that includes TFTs formed with oxide semiconductors is extending. For example, oxide semiconductors are used in liquid crystal displays that are required to be high-definition, current-driven organic EL displays in which loads on thin film transistors are large, and, MEMS displays that are required to control actions of shutters at a high speed, and the like.

PRIOR ART DOCUMENT

Patent Document

Patent Document 1: JP-A-2013-50720

SUMMARY OF THE INVENTION

Problem to be Solved by the Invention

In an active matrix substrate that includes TFTs, light transmission films that are transparent and insulative can be provided between the TFTs and the substrate. For example, in an active matrix substrate of a MEMS display, a light transmission film can be arranged between shutters controlled by TFTs and a substrate on which the shutters are provided.

In the process of forming such an active matrix substrate, a high temperature annealing treatment can be applied at a temperature of 400° C. or higher, for about one to two hours, after oxide semiconductor films of TFTs are formed. Hereinafter an annealing treatment at 400° C. or higher is referred to as a "high temperature annealing treatment". By high temperature annealing, transistor properties of TFTs in which oxide semiconductor is used can be stabilized. The temperature of the high temperature annealing is the highest temperature in the active matrix substrate forming process.

In contrast, in a case where amorphous silicon is used for forming semiconductor films of TFTs, the highest temperature in the active matrix substrate forming process is more or less about 300° C. to 330° C. (for example, the temperature when films of silicon nitride or amorphous silicon are formed). Further, the duration of high temperature annealing for TFTs in which oxide semiconductor is used tends to be longer, for example, one hour or more. In a case where oxide semiconductor is used in TFTs, therefore, problems occur that did not arise in the conventional active matrix substrate manufacturing process.

For example, in the manufacturing process, cracks occur at an end of a light transmission film in some cases, due to the high temperature annealing treatment when TFTs are formed, or the like, and these cracks could adversely affect the functions of layers above the light transmission film. This was discovered by the inventors of the invention of the present application. Such problems can occur to a display device that has such a configuration that thin film transistors are arranged an a light transmission film formed on a substrate, that is, for example, a liquid crystal display device.

The present application discloses an active matrix substrate, a display device, and a manufacturing method to suppress the occurrence of cracks at an end of a film provided between thin film transistors and a substrate.

Means to Solve the Problem

An active matrix substrate according to one embodiment of the present invention that includes a plurality of pixels includes: a substrate; a plurality of thin film transistors arranged in matrix; a light transmission film provided between the substrate and the thin film transistors; and a protection layer that covers an end surface of a periphery of the light transmission film, the end surface of the light transmission film being not parallel with the substrate. The thin film transistor includes a gate electrode, a gate insulating film, a semiconductor film opposed to the gate electrode with the gate insulating film being interposed therebetween, as well as a drain electrode and a source electrode that are connected to the semiconductor film and are opposed to each other with the semiconductor film being interposed therebetween. The protection film is arranged between the light transmission film and the semiconductor film.

Effect of the Invention

According to the active matrix substrate or the manufacturing method of the same according to the disclosure of the present application, the occurrence of cracks at an end of a film formed between thin film transistors and a substrate can be suppressed.

MODE FOR CARRYING OUT THE INVENTION

Figure 1:
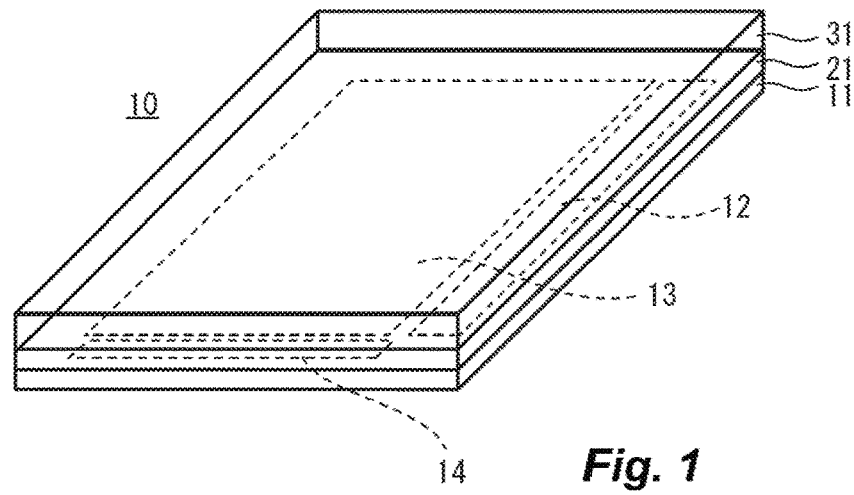
FIG. 1 is a perspective view illustrating a schematic configuration of a display device.

An active matrix substrate according to one embodiment of the present invention that includes a plurality of pixels includes: a substrate; a plurality of thin film transistors arranged in matrix; a light transmission film provided between the substrate and the thin film transistors; and a protection layer that covers an end surface of a periphery of the light transmission film, the end surface of the light transmission film being not parallel with the substrate. The thin film transistor includes a gate electrode, a gate insulating film, a semiconductor film opposed to the gate electrode with the gate insulating film being interposed therebetween, as well as a drain electrode and a source electrode that are connected to the semiconductor film and are opposed to each other with the semiconductor film being interposed therebetween. The protection film is arranged between the light transmission film and the semiconductor film.

According to the above-described configuration, an end surface of a periphery of the light transmission film is covered with the protection film. Besides, the protection film is arranged between the semiconductor film and the light transmission film. Accordingly, the thin film transistors are formed on the light transmission film whose end surface is covered with the protection film. Cracks therefore hardly occur to the light transmission film, even if annealing is carried out at a high temperature in the step of forming the thin film transistors. Moreover, influences of cracks on layers above the light transmission film can be suppressed.

The end surface of the light transmission film may be inclined in such a manner that a height thereof from the substrate decreases as proximity thereof from a region where the pixels are arranged decreases. This makes it possible to make steps at the end of the light transmission film smaller. As a result, influences caused by steps at the end of the light transmission film, onto the members in upper layers of the light transmission film, can be reduced.

A line connected to the thin film transistors may be provided. In this case, at least a part of the line can be formed so as to be led out onto the protection film that covers the end surface of the light transmission film. In this configuration, the line is arranged on the protection film covering the end surface of the light transmission film. This allows the line to hardly become disconnected due to cracks occurring to the light transmission film.

The light transmission film can include a light-shielding area. This allows a light-shielding layer to be provided on the substrate.

The light-shielding area, for example, can be formed with the light-shielding film provided between the light transmission film and the substrate. With this configuration, steps formed by the light-shielding film can be reduced by the light transmission film. This makes it easier to flatten the surface of the light transmission film covering the light-shielding film. Further, the light transmission film makes it easier to ensure a distance between members laminated on the light transmission film and the light-shielding film.

The protection film may extend from the end surface of the light transmission film toward the upper surface of the light transmission film, so as to be in contact with the upper surface. This makes it possible to protect the upper surface of the light transmission film with the protection film.

The above-described display device can further include a light-shielding film provided between the light transmission film and the substrate. In this case, the light transmission film may be provided so as to be in contact with the upper surface of the light-shielding film. In this configuration, no other film is interposed between the light transmission film and the light-shielding film, which allows the manufacturing process to become simpler.

The protection film can be formed so as to cover the end surface of the light transmission film and the upper surface of the light transmission film. A transparent insulating film can be provided between the protection film and the upper surface of the light transmission film. A sum of a thickness of the protection film and a thickness of the transparent insulating film may be smaller than 200 nm. This allows better adhesiveness to be provided between the light transmission film and a film in another layer.

The light transmission film can be formed with an SOG film, which is one example of a coating-type material. This makes it easier to make the step of the light-shielding film smaller. Further, though some of materials of the SOG film tend to have cracks at a high temperature, the protection film thus provided allows the occurrence of cracks to be effectively suppressed even if the light transmission film is formed with a SOG film.

The semiconductor film can be formed with an oxide semiconductor. In the process of manufacturing thin film transistors in which an oxide semiconductor is used, high temperature annealing (for example, annealing at a temperature of 400° C. or above for about one to two hours) is applied after the oxide semiconductor film is formed. With high temperature annealing, the properties of the thin film transistors in which an oxide semiconductor is used can be stabilized. Here, the protection film arranged between the semiconductor film formed with an oxide semiconductor and the light transmission film is capable of suppressing the occurrence of cracks in the light transmission film caused by the high temperature annealing of the oxide semiconductor.

Embodiments of the present invention encompass a display device that includes the above-described active matrix substrate. The display device may further include a counter substrate arranged so as to be opposed to the substrate, and a ring-shaped sealing member for bonding peripheral portions of the substrate and the counter substrate. In this case, the end surface of the light transmission film can be arranged on an inner side of the sealing member when viewed in a direction vertical to the substrate.

The display device may further include a shutter portion provided on the substrate so as to correspond to each of the thin film transistors, the shutter portion controlling an amount of light passing through a light-transmitting area, with use of a shutter body controlled by driving of the thin film transistor. In other words, the display device can be a MEMS display.

The display device can be an organic electroluminescence display, or a liquid crystal display.

A method in one embodiment of the present invention relates to a method for manufacturing an active matrix substrate that includes a plurality of thin film transistors arranged in matrix. The method includes the steps of: forming a light transmission film on a substrate; forming a protection film on the light transmission film so that the protection film covers an end surface of a periphery of the light transmission film, the end surface of the light transmission film being not parallel with the substrate; and forming the thin film transistors on the light transmission film on which the protection film is formed. The step of forming the thin film transistors includes sub-steps of forming gate electrodes, a gate insulating film, semiconductor films opposed to the gate electrodes with the gate insulating film being interposed therebetween, as well as drain electrodes and source electrodes opposed to each other on the gate insulating film, with the semiconductor films being interposed therebetween, respectively.

According to the above-described manufacturing method, a protection film covering the end surface of the light transmission film is formed. In the step of forming thin film transistors, therefore, the end surface of the light transmission film is protected. Accordingly, even if high temperature annealing is carried out when the semiconductors of the thin film transistors are formed, cracks hardly occur to the light transmission film. As a result, influences exerted by cracks in the light transmission film onto films in upper layers can be suppressed.

The above-described manufacturing method may include a first annealing step of firing the film laminated on the substrate, before the step of forming the protection film, and a second annealing step of firing the films laminated on the substrate, after the step of forming the protection film. In this case, a treatment temperature in the second annealing step can be higher than a treatment temperature in the first annealing step. According to this manufacturing method, annealing is carried out at a temperature higher than the annealing temperature before the protection film is formed, in a state in which the end surface of the light-shielding layer is covered with the protection film. This efficiently suppresses the occurrence of cracks in the end surface of the light-shielding layer due to high temperature.

The first annealing step can be, for example, annealing that is carried out before the protection film is formed, in a state in which a film for forming the light transmission film is laminated. The second annealing step can be, for example, annealing in a state in which the light transmission film is covered with the protection film. Further, the manufacturing method can include a third annealing step that is carried out in the above-described step of forming the semiconductor film of the thin film transistor, and the treatment temperature of the second annealing can be at the same level as, or higher than, a treatment temperature of the third annealing.

The light-shielding area of the light transmission film can be arranged so as to overlap with at least a plurality of the thin film transistors when viewed in the direction vertical to the substrate. For example, the light-shielding film can be arranged so as to overlap with at least a plurality of the thin film transistors.

With the above-described configuration, external light advancing from the substrate side to the inside of the display device is blocked in the light-shielding area of the light transmission film, and is prevented from reaching the thin film transistors. This therefore makes it possible to prevent threshold value properties and the like of the thin film transistors from deteriorating due to external light.

The light-shielding area preferably is arranged in entire areas except for the light-transmitting areas in the pixels, when viewed in the direction vertical to the substrate.

According to the above-described configuration, the light-shielding area of the light transmission film is arranged in entire areas except for the light-transmitting areas. This therefore makes it possible to more efficiently block external light advancing from the substrate side. Further, with the above-described configuration, external light advancing from the substrate side into the display device is prevented from being reflected by metal films and the like laminated on the light-shielding film toward the display viewing side. As a result, reductions in the contrast caused by the reflection of external light can be suppressed.

In the display device, each shutter portion can include, for example: a shutter body that is movable according to a voltage applied thereto; a shutter beam that is electrically connected with the shutter body, and is elastically deformed according to a voltage applied thereto so as to make the shutter body movable; a shutter beam anchor that is electrically connected with the shutter beam and supports the shutter beam; a driving beam opposed to the shutter beam; and a driving beam anchor that is electrically connected with the driving beam and supports the driving beam. The thin film transistor, for example, can be electrically connected to the driving beam anchor.

In the peripheral portion of the substrate, an angle formed between the surface of the substrate and the end surface of the light transmission film can be smaller than 20°. This makes it possible to effectively suppress disconnection of lines and the like that get onto the light transmission film from the surface of the substrate.

The above-described display device may further include a counter substrate that is arranged so as to be opposed to the substrate, and a ring-shaped sealing member that bonds peripheral portions of the substrate and the counter substrate. In this case, in the peripheral portion of the substrate, the sealing member can be arranged so as not to overlap an inclined surface of the light transmission film.

The semiconductor film of the thin film transistor can be formed with an oxide semiconductor. The thin film transistors, which include oxide semiconductor, tend to deteriorate due to light; for example, threshold value properties thereof tend to vary due to light. With the light-shielding film formed in at least areas that overlap the thin film transistors, as is the case with the above-described configuration, however, light is prevented from being projected to the thin film transistors from the substrate side. The above-described configuration is therefore preferable in a case where the thin film transistors are formed with oxide semiconductor films.

The following describes preferred embodiments of the present invention in detail, while referring to the drawings. The drawings referred to in the following description illustrate, for convenience of description, only the principal members necessary for describing the present invention, among the constituent members in the embodiments, in a simplified manner. The present invention, therefore, may include arbitrary constituent members that are not described in the descriptions of the following embodiments. Further, the dimension ratios of the constituent members illustrated in the drawings do not necessarily indicate the real sizes, the real dimension ratios, etc.

Embodiment 1

Figure 2:
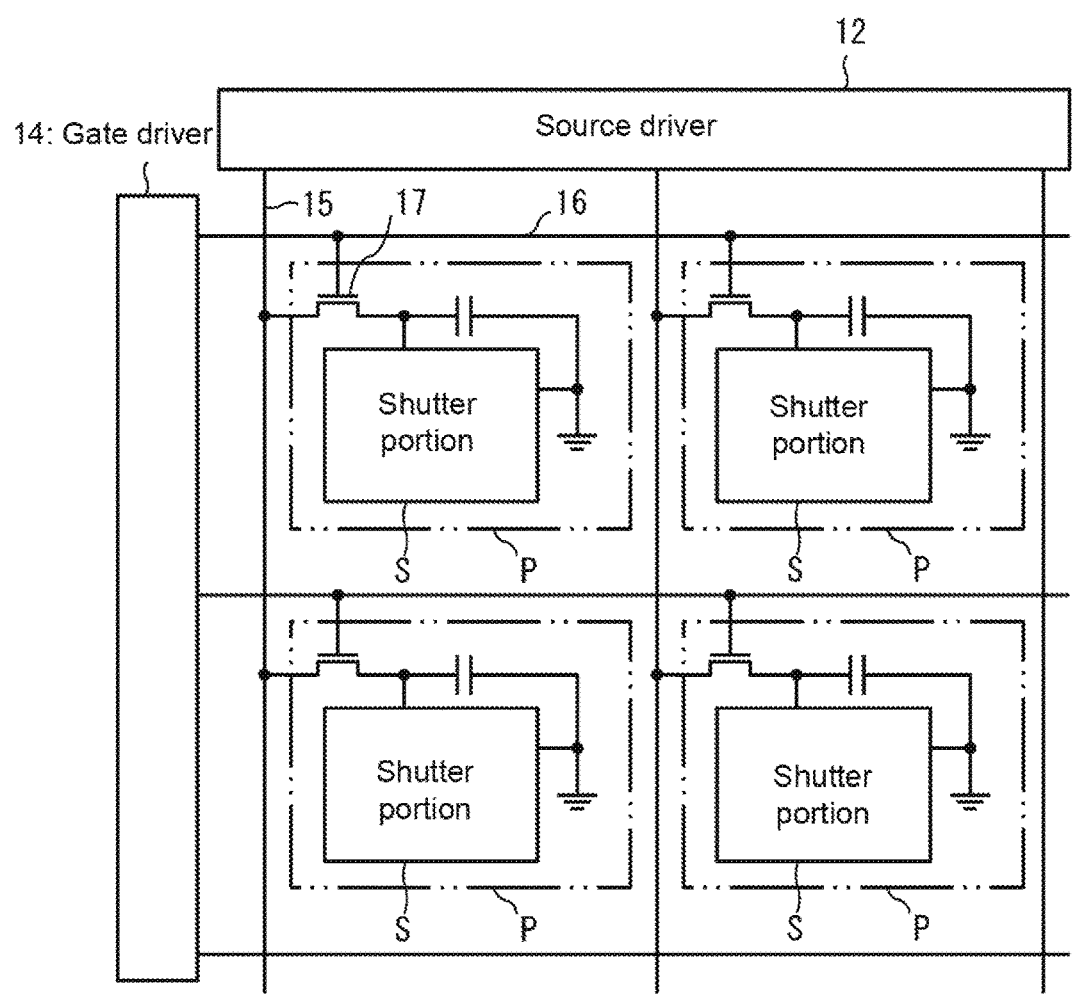
FIG. 2 is an equivalent circuit diagram of the display device.

FIG. 1 is a perspective view illustrating an exemplary configuration of a display device in the present embodiment. FIG. 2 is an equivalent circuit diagram of the display device 10. The display device 10 illustrated in FIG. 1 is a transmission type The MEMS display. The display device 10 has a configuration in which a first substrate 11, a second substrate 21, and a backlight 31 are laminated in the stated order.

The first substrate 11 includes a display region 13 in which pixels P for displaying images are arranged, as well as a source driver 12 and a gate driver 14 that supply signals for controlling the transmission of light of each pixel P. The second substrate 21 is provided so as to cover a backlight surface of the backlight 31.

The backlight 31 includes, for example, a red color (R) light source, a green color (G) light source, and a blue color (B) light source so as to project back light to each pixel P. The backlight 31, based on backlight control signals input thereto, causes a prescribed light source to emit light.

As illustrated in FIG. 2, a plurality of data lines 15 and a plurality of gate lines 16 that extend intersecting with the data lines 15 are provided on the first substrate 11. The pixels P are defined by the data lines 15 and the gate lines 16. The pixels P are provided at positions opposed to points of intersection between the data lines 15 and the gate lines 16, respectively. At each pixel P, a shutter portion S and a TFT 17 that controls the shutter portion S are provided. The TFT 17 is connected to the data line 15 and the gate line 16.

Each data line 15 is connected to the source driver 12, and each gate line 16 is connected to the gate driver 14. The gate driver 14 sequentially inputs, to each gate line 16, a gate signal that switches the gate line 16 to a selected state or a non-selected state, thereby scanning the gate lines 16. The source driver 12 inputs data signals to each data line 15 in synchronization with the scanning of the gate lines 16. This causes desired signal voltages to be applied to respective shutter portions S of the pixels P connected to the selected gate line 16.

Figure 3:
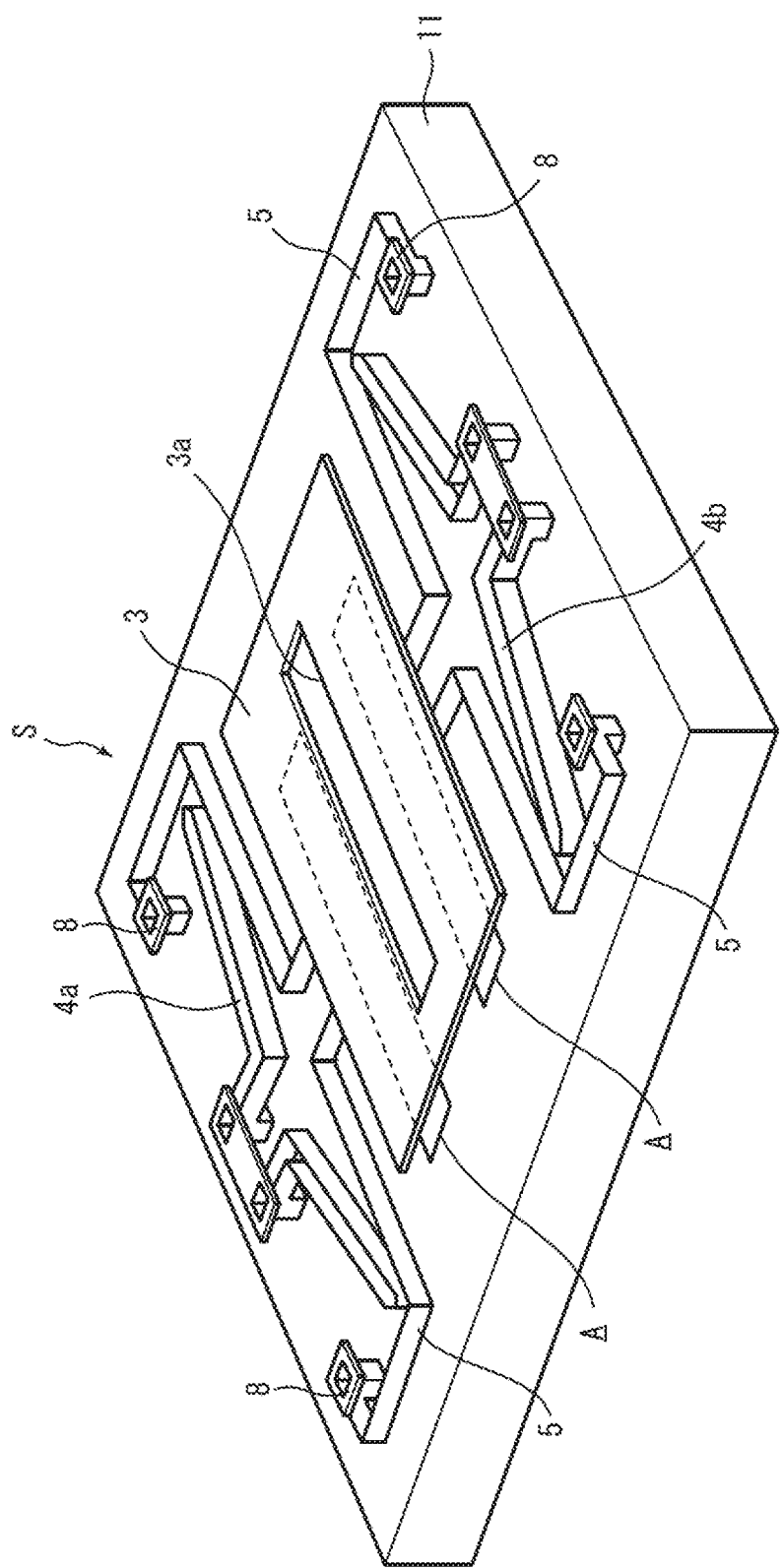
FIG. 3 is a perspective view of a shutter portion.

FIG. 3 is a perspective view illustrating a detailed exemplary configuration of the shutter portion S at one pixel P. The shutter portions S includes a shutter body 3, a first electrode portion 4a, a second electrode portion 4b, and a shutter beam 5.

The shutter body 3 has a plate-like shape. In FIG. 3, for convenience sake of illustration, the shutter body 3 is illustrated as having a flat plate shape, but actually, as illustrated in the cross-sectional views in FIG. 5 to be described below, the shutter body 3 has a shape having folds in the lengthwise direction of the shutter body 3. The direction vertical to the lengthwise direction (long side direction) of the shutter body 3, that is, the transverse direction (short side direction), is a direction in which the shutter body 3 is driven (movement direction). The shutter body 3 has an opening 3a that extends in the lengthwise direction. The opening 3a is formed in a rectangular shape having long sides extending in the lengthwise direction of the shutter body 3.

Figure 4:
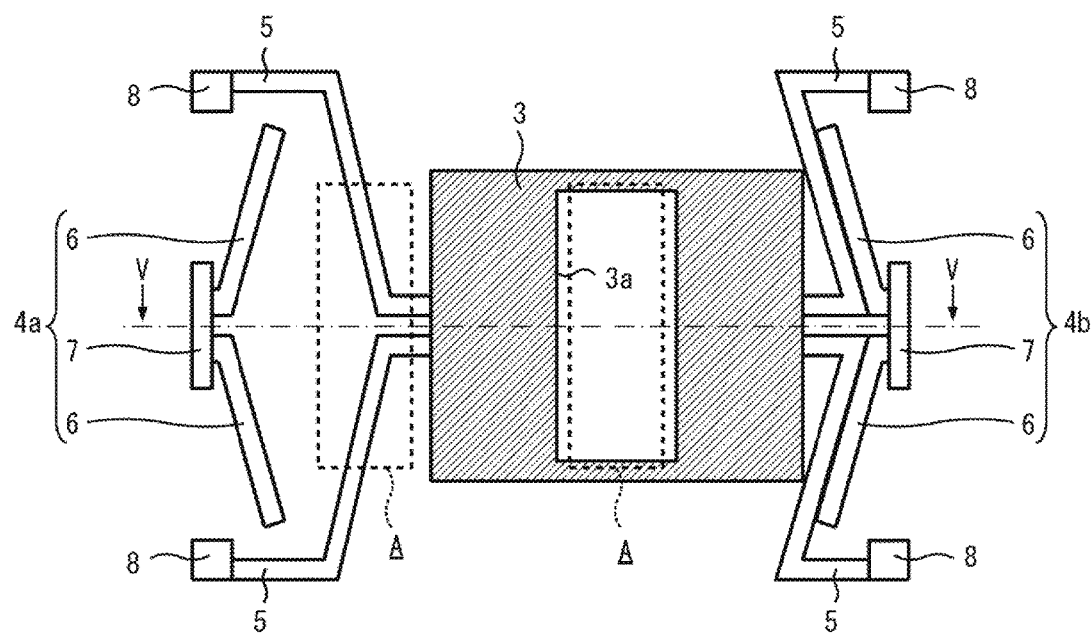
FIG. 4 is a plan view for explaining an operation of the shutter portion.

As illustrated in FIG. 4, the first electrode portion 4a and the second electrode portion 4b are arranged on both sides of the shutter body 3, the sides being sides in the driving direction. Each of the first electrode portion 4a and the second electrode portion 4b has two driving beams 6 and a driving beam anchor 7. The two driving beams 6 are arranged so as to be opposed to the shutter beams 5, respectively. The driving beam anchor 7 is electrically connected with the two driving beams 6. Further, the driving beam anchor 7 supports the two driving beams 6. A predetermined voltage is applied to the first electrode portion 4a and the second electrode portion 4b, as is described below.

The shutter body 3 is connected to one end of each shutter beam 5. The other end of each shutter beam 5 is connected to the shutter beam anchor 8 fixed to the first substrate 11. The shutter beams 5 are connected to end portions in the driving direction of the shutter body 3, respectively. The shutter beams 5 extend from the portions connected with the shutter body 3 outward, and further extend along the end portions in the driving direction of the shutter body 3, to be connected to the shutter beam anchors 8. The shutter beams 5 have flexibility. The shutter body 3 is supported in a state movable with respect to the first substrate 11, by the shutter beam anchors 8 fixed to the first substrate 11, and the shutter beams 5 that have flexibility and that connect the shutter beam anchors 8 and the shutter body 3. Further, the shutter body 3 is electrically connected through the shutter beam anchors 8 and the shutter beams 5 to the lines provided on the first substrate 11.

The first substrate 11 has light-transmitting areas A as illustrated in FIG. 3. The light-transmitting area A has, for example, a rectangular shape corresponding to the opening 3a of the shutter body 3. For example, two light-transmitting areas A are provided with respect to one shutter body 3. The two light-transmitting areas A are arranged so as to be arrayed in the short side direction of the shutter body 3. In a case where no electric force is exerted between the shutter body 3 and the first electrode portion 4a, and between the shutter body 3 and the second electrode portion 4b, the opening 3a of the shutter body 3 is in a state of not overlapping the light-transmitting area A.

In the present embodiment, the driving circuit that controls the shutter portions S supplies potentials having different polarities to the first electrode portion 4a and the second electrode portion 4b, respectively, the polarities varying with time. In this case, the driving circuit can control the polarity of the potential of the first electrode portion 4a and the polarity of the potential of the second electrode portion 4b in such a manner that these polarities are different at all times. Further, the driving circuit that controls the shutter portions S supplies a fixed potential having a positive polarity or a negative polarity to the shutter body 3.

Figure 5:
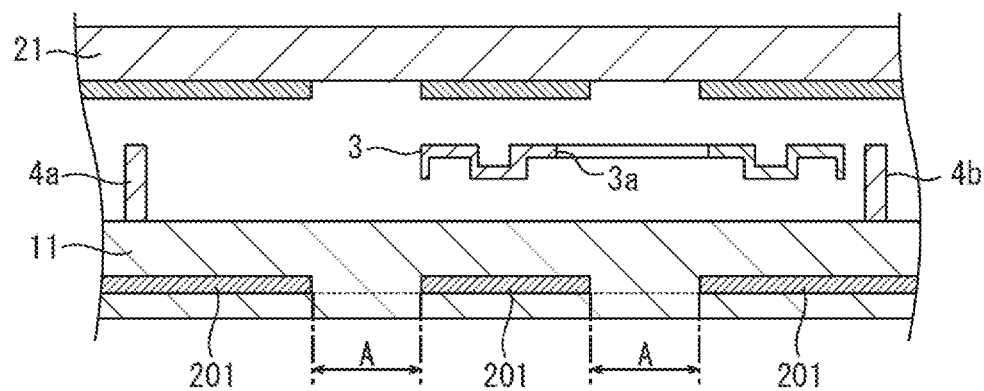
FIG. 5 is a cross-sectional view taken along line V-V in FIG. 4.

The following description describes an exemplary case where a potential at a high (H) level is supplied to the shutter body 3. When the driving beam 6 of the first electrode portion 4a has a potential at H level and the driving beam 6 of the second electrode portion 4b has a potential at low (L) level, electrostatic force causes the shutter body 3 to move toward the side of the second electrode portion 4b having a potential at L level. As a result, as illustrated in FIGS. 4 and 5, the opening 3a of the shutter body 3 overlaps the light-transmitting area. A, whereby the state shifts to an opened state in which light from the backlight 31 passes therethrough to the first substrate 11 side.

Figure 6:
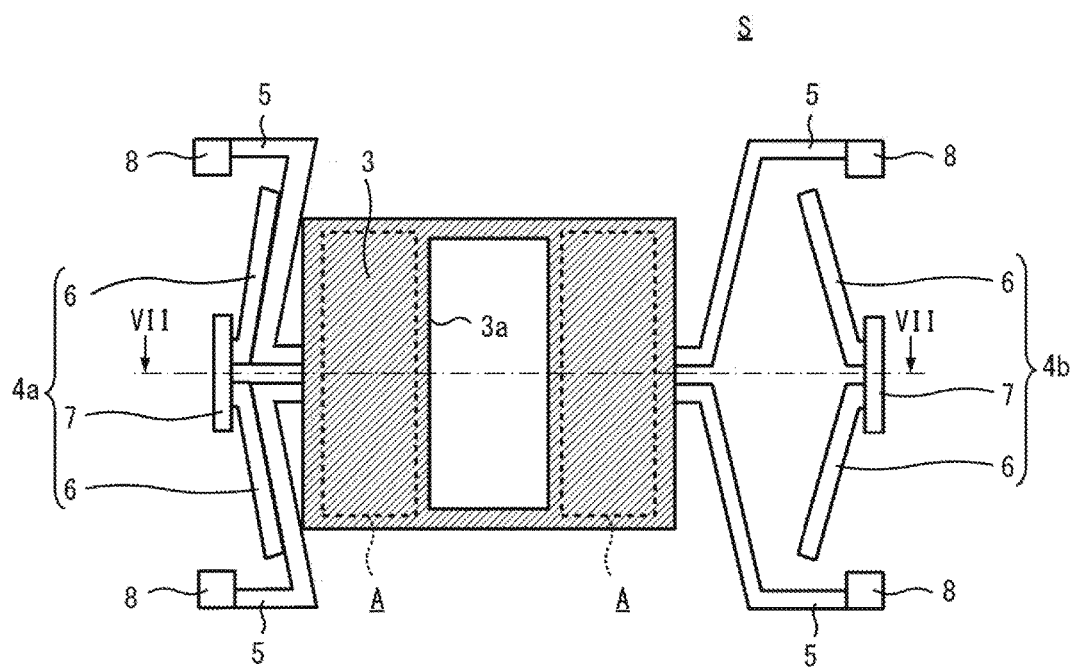
FIG. 6 is a plan view for explaining an operation of the shutter portion.
Figure 7:
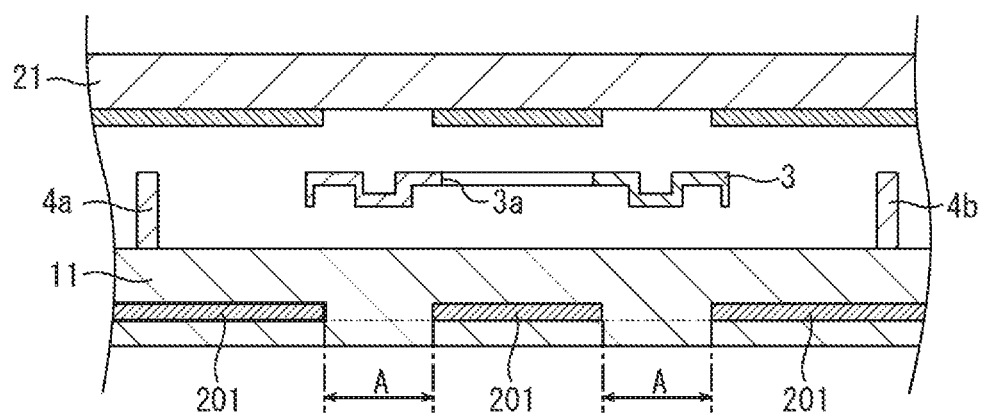
FIG. 7 is a cross-sectional view taken along line VII-VII in FIG. 6.

When the potential of the first electrode portion 4a is at L level and the potential of the second electrode portion 4b is at H level, the shutter body 3 moves toward the first electrode portion 4a side. Then, as illustrated in FIGS. 6 and 7, the portion other than the opening 3a of the shutter body 3 overlaps the light-transmitting area A of the first substrate 11. In this case, the state shifts to a closed state in which light from the backlight 31 does not pass toward the first substrate 11 side. In the shutter portions S of the present embodiment, therefore, the shutter body 3 is moved by controlling the potentials of the shutter body 3, the first electrode portion 4a, and the second electrode portion 4b, so as to switch the opened state and the closed state of the light-transmitting area A. In a case where a potential at L level is supplied to the shutter body 3, the shutter body 3 makes an operation reverse to that described above.

(Exemplary Configuration of First Substrate)

Figure 8:
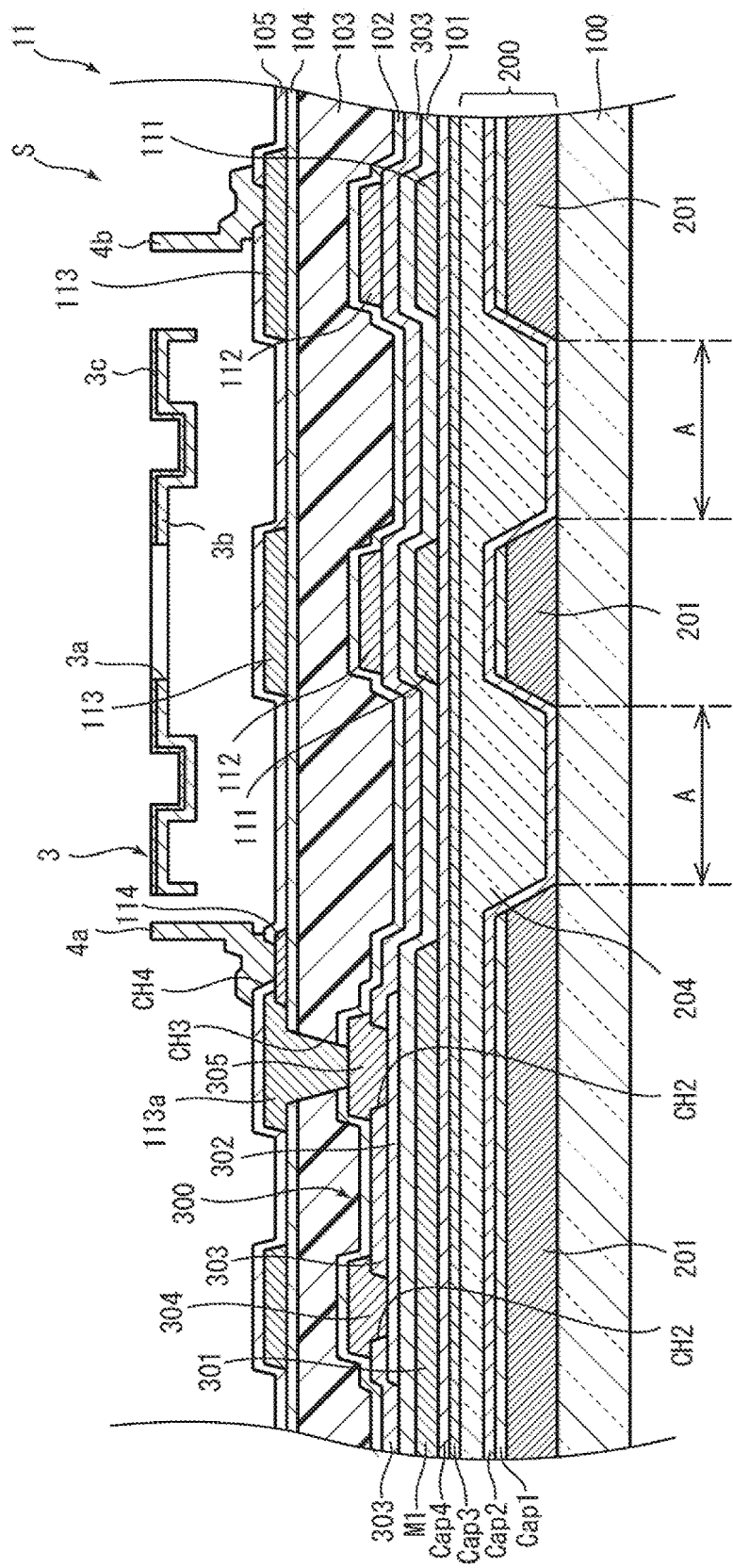
FIG. 8 is a cross-sectional view of a first substrate.

FIG. 8 is a cross-sectional view illustrating an exemplary configuration of the first substrate 11.

The first substrate 11 has such a configuration that a light-shielding layer 200, TFTs 300, and shutter portions S are formed on the translucent substrate 100. In FIG. 8, one TFT is illustrated, but, actually, a plurality of TFTs may be included in a single pixel P. The light-shielding layer 200 includes a light-shielding film 201, a first transparent insulating film Cap1, a second transparent insulating film Cap2, and a light transmission film 204. On the light-shielding layer 200, a third transparent insulating film Cap3 and a fourth transparent insulating film Cap4 are laminated. Each TFT 300 includes a gate electrode 301, a semiconductor film 302, an etching stopper layer 303, a source electrode 304, and a drain electrode 305.

The translucent substrate 100 can be formed with, for example, glass or a resin. From the viewpoint of heat-resisting properties, it is preferable to use glass.

The light-shielding layer 200 is provided on the translucent substrate 100. More specifically, the light-shielding layer 200 is arranged in a layer between the shutter portions S and the translucent substrate 100. Further, the light-shielding layer 200 is arranged in the layer between the layer in which the TFTs 300 are arranged and the translucent substrate 100. In the light-shielding layer 200, the part of the light-shielding film 201 serves as the light-shielding area. In this example, the light-shielding film 201 is in contact with the translucent substrate 100.

Figure 9:
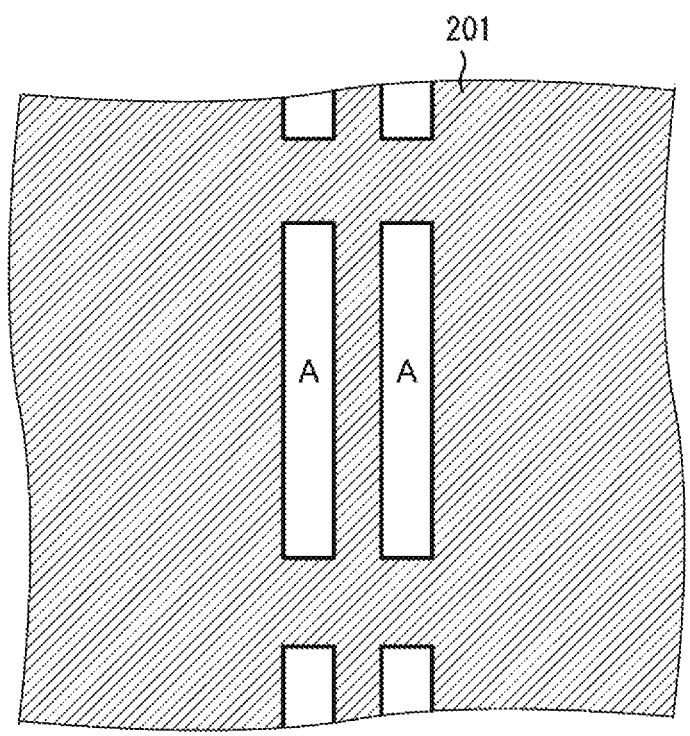
FIG. 9 is a plan view illustrating a light-shielding film.

FIG. 9 illustrates an exemplary arrangement of the light-shielding film 201 when it is viewed in a direction vertical to the translucent substrate 100. In the example illustrated in FIG. 9, the light-shielding film 201 is formed so as to cover the display region 13 other than the light-transmitting areas A. This makes it possible to prevent external light that has advanced from the display viewing side into the display device 10 from advancing into the second substrate 21 side beyond the light-shielding film 201.

The light-shielding film 201 can be formed with a material that hardly reflects light. This makes it possible to prevent external light that has advanced from the display viewing side into the display device 10 from being reflected by the light-shielding film 201 and going back to the display viewing side. Further, the light-shielding film 201 can be formed with the material having a high resistance. This makes it possible to prevent a great parasitic capacitance from being generated between the light-shielding film 201 and conductive films forming the TFTs 300 and the like. Still further, since the light-shielding film 201 is formed prior to the TFT manufacturing process, a material that has less influence to TFT properties in subsequent processing operations in the TFT manufacturing process, and that withstand the processing operations in the TFT manufacturing process is preferably selected for a material for light-shielding film 201. Examples of the material of the light-shielding film 201 that satisfy such requirements include, for example, a high-melting-point resin film (polyimide, etc.) and a spin-on-glass (SOG) film that are colored in a dark color. Still further, the light-shielding film 201, for example, can contain carbon black so as to be colored in a dark color.

The light transmission film 204 is an insulating film that is provided so as to cover the light-shielding film 201 between the translucent substrate 100 and the shutter portions S. Further, the light transmission film 204 is provided in the layer between the translucent substrate 100 and the layer where the TFTs 300 are arranged, like the light-shielding film 201. The light transmission film 204 is filled in areas where the light-shielding film 201 is not provided when viewed in the direction vertical to the translucent substrate 100, whereby steps occurring due to the light-shielding film 201 are eliminated. Still further, the light transmission film 204 covers an entirety of the display region 13 including the light-shielding film 201, thereby flattening the surface of the film covering the light-shielding film 201. The film thickness of the light-shielding film 201 can be set to, for example, 0.5 µm to 1.5 µm. The film thickness of the light transmission film 204 can be set to, for example, about 1 to 3 µm. Still further, the film thickness of the light transmission film 204 can be set to 0.5 µm or greater than the film thickness of the light-shielding film 201.

The light transmission film 204 can be formed with, for example, a coating-type material. The coating-type material is a material that is applicable in a liquid state. The coating-type material, in a state of being contained in a coating liquid, is spread over a surface on which a film is to be formed, and is cured by a heat treatment or the like, whereby a film of the same is formed. For example, a solution of the coating-type material dissolved in a solvent is dropped on the surface on which a film is to be formed, and the surface is rotated, whereby the coating-type material can be applied on the surface. In this case, the coating-type material is applied so as to reducing protrusions and recesses of the surface. The solvent of the solution thus applied is evaporated by a heat treatment or the like, whereby a film having a flat surface is formed.

As the coating-type material used for forming the light transmission film 204, a material for a transparent high-melting-point resin film (polyimide, etc.), a material for an SOG film, or the like, can be used. The SOG film is, for example, a film that is formed with use of a solution obtained by dissolving a silicon compound in an organic solvent, and contains silicon dioxide as a principal component. Examples of a material that can be used for forming the SOG film include: inorganic SOG containing silanol ($Si(OH)_4$) as a principal component; organic SOG containing silanol having alkyl groups ($R_xSi(OH)_{4-x}$ (R: alkyl group)) as a principal component; and a sol-gel material in which an alkoxide of silicon or a metal is used. Examples of inorganic SOG include a hydrogen silsesquioxane (HSQ)-based material.

Examples of organic SOG include a methyl silsesquioxane (MSQ)-based material. Examples of the sal-gel material include TEOS (tetraethoxysilane). By applying such a material and firing the same, an SOG film can be formed. Materials for SOG films are not limited to those examples described above. Examples of the film forming method by material application include spin coating, and slit coating. The light transmission film 204 may have photosensitivity.

By forming the light transmission film 204 with a coating-type material, protrusions and recesses formed in the pattern of the light-shielding film 201 can be flattened easily. When the patterning is performed in the process for manufacturing the TFTs 300, therefore, the pooling of liquid such as resist or the like can be eliminated, whereby excellent patterning accuracy can be achieved. In this way, the light transmission film 204 can be made a flattening film.

Further, by forming the light transmission film 204 with a coating-type material, a sufficient thickness of the light transmission film 204 (the thickness of portions thereof on which the light-shielding film 201 is formed) can be ensured easily. For example, the thickness of the light transmission film 204 can be increased to about 0.5 to 3 µm. For example, in a case where a material having a low resistance is used for forming the light-shielding film 201, a sufficient distance between the light-shielding film 201 and a conductive film that forms the TFTs 300 can be ensured by the light transmission film 204. This makes it possible to suppress parasitic capacitance generated between the light-shielding film 201 and electrodes or lines of the TFTs 300.

In this way, in the present embodiment, the light transmission film 204 covering the light-shielding film 201 is provided between the translucent substrate 100 and the shutter portions S. On the light transmission film 204, the TFTs 300 for controlling the shutter portions 5, and the lines are formed. With the light transmission film 204 thus formed, the properties of the TFTs 300 are prevented from deteriorating due to steps formed due to the light-shielding film 201, parasitic capacitance, and the like.

In the example illustrated in FIG. 8, the first transparent insulating film Cap1 is provided on the upper surface of the light-shielding film 201. The second transparent insulating film Cap2 is provided so as to cover the light-shielding film 201 and the first transparent insulating film Cap1. On the second transparent insulating film Cap2, the light transmission film 204 is provided. In other words, the first transparent insulating film Cap1 and the second transparent insulating film Cap2 are provided between the light-shielding film 201 and the light transmission film 204. In the manufacturing process, in a state in which the light-shielding film 201 is covered with the first transparent insulating film Cap1, high temperature annealing (hereinafter annealing at 400° C. or higher is referred to as "high temperature annealing") can be carried out. Here, the first transparent insulating film Cap1 prevents the dark color material in the light-shielding film 201 from becoming transparent due to high temperature annealing. Further, the first transparent insulating film Cap1 makes it possible to achieve improved wettability and adhesiveness with a resist material when the light-shielding film 201 is patterned. In addition, the second transparent insulating film Cap2 is provided so as to cover the upper and side surfaces of the light-shielding film 201. This second transparent insulating film Cap2 makes it possible to achieve improved adhesiveness to the light transmission film 204.

In the display region 13, the third transparent insulating film Cap3 is provided so as to cover the light transmission film 204. The third transparent insulating film Cap3 makes it possible to achieve improved wettability and adhesiveness with a resist material when the light transmission film 204 is patterned. On the third transparent insulating film Cap3, the fourth transparent insulating film Cap4 is provided. The fourth transparent insulating film Cap4 covers the upper surface of the third transparent insulating film Cap3 and the end surface of the light transmission film 204, as is described below.

On the fourth transparent insulating film Cap4, the gate electrodes 301 and the lines 111 are formed. The gate electrodes 301 and the line 111 are formed with first conductive films M1. The first conductive film M1 is formed in an area that overlaps with the light-shielding film 201 in the direction vertical to the direction vertical to the translucent substrate 100. A gate insulating film 101 is formed so as to cover the gate electrodes 301 and the lines 111. By providing the fourth transparent insulating film Cap4, the fixability of the light transmission film 204 with the first conductive film M1 or the gate insulating film 101 can be improved.

The materials for the first to fourth transparent insulating films Cap1 to Cap4 are not limited particularly. For example, materials that provide inorganic insulating films can be used. Additionally, as materials for the first to fourth transparent insulating films Cap1 to Cap4, materials with which films can be formed by CVD can be used.

The sum of the thickness of the third transparent insulating film Cap3 and the thickness of the fourth transparent insulating film can be, for example, 200 nm or less. This allows the light transmission film 204 and the third transparent insulating film Cap3 to have excellent adhesiveness to each other. As one example, the configuration can be such that the third transparent insulating film Cap3 has a thickness of about 100 nm, and the fourth transparent insulating film Cap4 has a thickness of about 50 nm. The thickness of the third transparent insulating film Cap3 and the thickness of the fourth transparent insulating film, however, are not limited to specific values.

At, a position opposed to the gate electrode 301 with the gate insulating film 101 being interposed therebetween, the semiconductor film 302 is formed. The semiconductor film 302 can be formed with an oxide semiconductor. The oxide semiconductor has characteristics of high mobility and low leakage current. The semiconductor film 302 may contain, for example, at least one kind of metal element among In, Ga, and Zn. As an example of the oxide semiconductor, the semiconductor layer 302 contains, for example, a semiconductor of an In—Ga—Zn—O type. Here, the In—Ga—Zn—O-based semiconductor is a ternary oxide of indium (In), gallium (Ga), and zinc (Zn), in which the ratio (composition ratio) of In, Ga, and Zn is not limited particularly, and examples of the composition ratio of the In—Ga—Zn—O-based semiconductor include, for example, In:Ga:Zn=2:2:1, In:Ga:Zn=1:1:1, In:Ga:Zn=1:1:2 or the like. The semiconductor film 302 can be formed with an oxide semiconductor film that contains an In—Ga—Zn—O-based semiconductor as described above. The channel-etch type TFT having an active layer that contains an In—Ga—Zn—O-based semiconductor is referred to as "CE-InGaZnO-TFT" in some cases. The In—Ga—Zn—O-based semiconductor may be amorphous, or alternatively, may be crystalline. The crystalline In—Ga—Zn—O-based semiconductor is preferably a crystalline In—Ga—Zn—O-based semiconductor in which the c-axis is aligned approximately vertically to the layer surfaces.

The semiconductor layer 302 may contain another oxide semiconductor instead of the In—Ga—Zn—O-based semiconductor. More specifically, the semiconductor layer 302 may contain, for example, a Zn—O-based semiconductor (ZnO), an In—Zn—O-based semiconductor (IZO (registered trademark)), a Zn—Ti (titanium)-O-based semiconductor (ZTO), a Cd (cadmium)-Ge (germanium)-O-based semiconductor, a Cd—Pb (lead)-O-based semiconductor, a CdO (cadmium oxide)-Mg (magnesium)-Zn—O-based semiconductor, an In—Sn (tin)-Zn—O-based semiconductor (for example, $In_2O_3$—$SnO_2$—ZnO), or an In—Ga (gallium)-Sn—O-based semiconductor.

The etching stopper layer 303 is provided so as to cover the semiconductor film 302. In a part of an area of the etching stopper layer 303 overlapping the semiconductor film 302, two contact holes CH2 are provided. At the positions corresponding to the contact holes CH2 on the semiconductor film 302, the source electrode 304 and the drain electrode 305 are provided. The source electrode 304 and the drain electrode 305 are connected to the semiconductor film 302 through the two contact holes CH2, respectively. In other words, on the semiconductor film 302, the source electrode 304 and the drain electrode 305 are arranged so as to be opposed to each other in the direction vertical to the lamination direction.

The source electrodes 304 and the drain electrodes 305 are formed with second conductive films M2. The second conductive films M2 also form the lines 112 and the like, in addition to the source electrodes 304 and the drain electrodes 305 of the TFTs 300.

The source electrodes 304 and the drain electrodes 305 are covered with a passivation film 102. The passivation film 102 is further covered with a flattening film 103 and a passivation film 104.

In the passivation film 102, the flattening film 103, and the passivation film 104, there are provided contact holes CH3 that reach the drain electrodes 305. On the passivation film 104, lines 113 are formed. Parts 113a of the lines 113 are provided so as to cover surfaces of the contact holes CH3, and are electrically connected with drain electrodes 305. The lines 113 are formed with third conductive films M3. The lines 113 are connected to the first electrode portions 4a, the second electrode portions 4b, the shutter bodies 3 and the like of the shutter portions S. The parts 113a of the lines 113 may be electrically connected with the transparent conductive films 114 provided on the surface of the passivation film 104. The lines 113 are covered with a passivation film 105.

On the passivation film 105, there are provided the shutter portions S. The configuration of the shutter portion S is as mentioned above. The shutter body 3, however, has a configuration in which the shutter main body 3b on the translucent substrate 100 side and a metal film 3c are laminated.

(Exemplary Configuration in the Vicinity of End of Light Transmission Film)

Figure 10A:
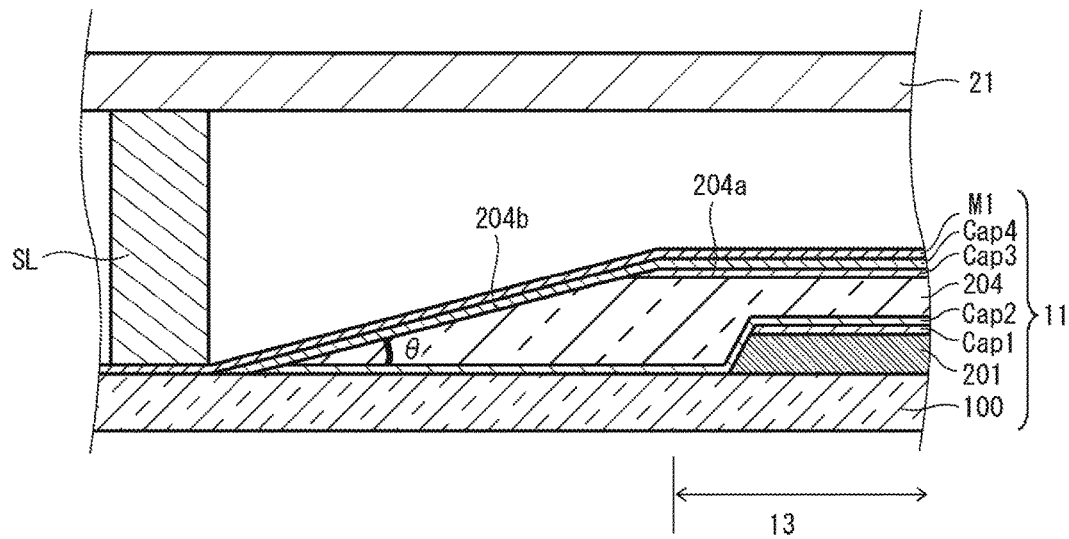
FIG. 10A is a cross-sectional view illustrating a peripheral portion of the light transmission film.

FIG. 10A is a cross-sectional view illustrating an exemplary configuration in the vicinity of an end of the light transmission film 204. In the example illustrated in FIG. 10A, the first substrate 11 and the second substrate 21 are bonded to each other at peripheral portions of the display region 13, with a sealing member SL. A space is encapsulated between the substrates 11, 21, with the sealing member SL. An end surface 204b of the light transmission film 204 is positioned outside the display region 13. On a peripheral portion of the translucent substrate 100, the end surface 204b in the periphery of the light transmission film 204 is positioned. The periphery of the light transmission film 204 is a portion that defines the outer circumference of the light transmission film 204 when viewed in the direction vertical to the translucent substrate 100. The sealing member SL is arranged on an outer circumference side with respect to the light transmission film 204, so as not to be in contact with the end surface 204b of the light transmission film 204. In other words, the end surface 204b of the light transmission film 204 is positioned on an inner side with respect to the sealing member SL (on the display region 13 side). The sealing member SL is provided at a position that does not overlap with the light-shielding layer 200 when viewed in the direction vertical to the translucent substrate 100. When viewed in the direction vertical to the translucent substrate 100, the sealing member SL is arranged in a ring form surrounding the light-shielding layer 200.

The end surface 204b of the light transmission film 204 is not parallel with the surface of the translucent substrate 100. In the example illustrated in FIG. 10A, the end surface 204b of the light transmission film 204 is an inclined surface having an angle against the surface of the translucent substrate 100.

Figure 10B:
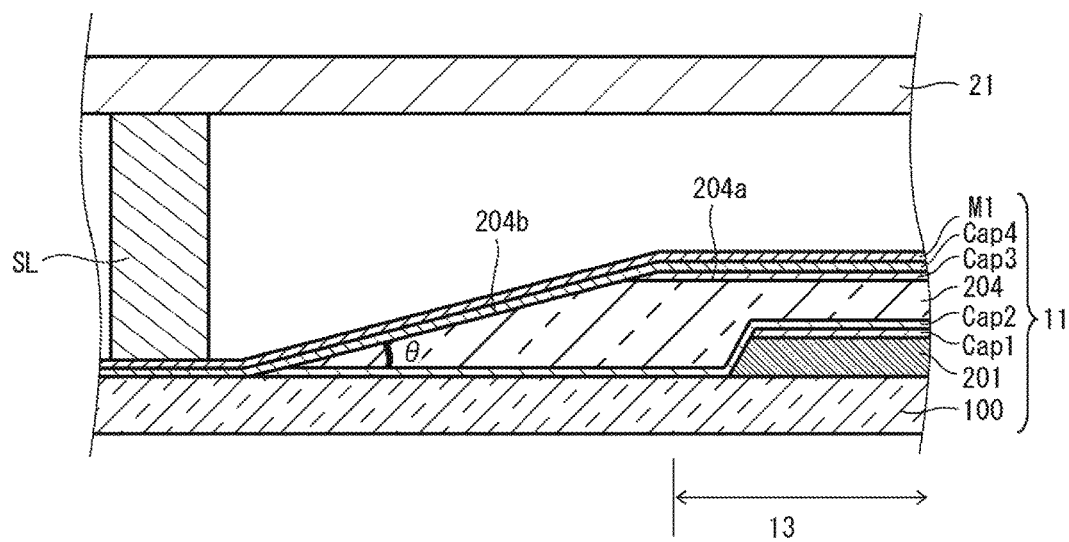
FIG. 10B is a cross-sectional view illustrating a modification example of a peripheral portion of the light transmission film.

The fourth transparent insulating film Cap4 is provided so as to cover the end surface 204b of the light transmission film 204. The fourth transparent insulating film Cap4 is in contact with the end surface 204b of the light transmission film 204. Further, the fourth transparent insulating film Cap4 is formed extending from above the end surface 204b of the light transmission film 204 toward the upper surface 204a, so as to cover the end surface 204b of the light transmission film 204 and upper surface 204a. The fourth transparent insulating film Cap4 is provided on an inner side with respect to the sealing member SL. The fourth transparent insulating film Cap4 is an exemplary protection film that covers the end surface of the light transmission film. The fourth transparent insulating film Cap4 may be formed so as to extend to outside the sealing member SL. For example, in the example illustrated in FIG. 10B, the sealing member SL is also provided at a position that overlaps with the fourth transparent insulating film Cap4, when viewed in the direction vertical to the translucent substrate 100. In other words, the fourth transparent insulating film Cap4 is formed so as to extend form the inner side to the outer side of the sealing member SL.

On a part of the fourth transparent insulating film Cap4 covering the end surface 204b of the light transmission film 204 positioned on the peripheral portion of the first substrate 11, the first conductive film M1 is formed. In other words, on the first substrate 11 (the active matrix substrate), in the peripheral portion outside the display region 13, a line is led out to the layer on the fourth transparent insulating film Cap4 covering the end surface 204b of the light transmission film 204. The first conductive film M1, forming the line, is a part of the line connected to the TFT 300 formed in the display region 13. For example, the gate electrode 301 of the TFT 300 or another line 111 is connected to the first conductive film M1 on the end surface 204b of the light transmission film 204. More specifically, lead-out lines are connected to a plurality of data lines 15 or the gate lines 16 (FIG. 2) pass over the end surface 204b of the light transmission film 204, and are led out of the display region 13. In this way, at least a part of the lines connected to the TFTs 300 in the display region 13 are led to outside of the display region 13 and the sealing member SL, by the lead-out lines provided over the end surface of the light-shielding layer 200. Between the lead-out lines and the end surface of the light-shielding layer 200 (the end surface 204b of the light transmission film 204 in the example illustrated in FIG. 10A), the fourth transparent conductive film Cap4 is provided. The lead-out lines provided over the end surface of the light-shielding layer 200, however, are not limited to the first conductive film M1, but the lines of the second conductive film M2 or the third conductive film M3 can be provided over the end surface of the light-shielding layer 200.

The light transmission film 204, in an outer peripheral portion of the display region 13, the film thickness gradually decreases, in such a direction as the proximity to the display region 13 decreases. The surface of the light transmission film 204 in the outer peripheral portion of the display region 13, that is, the end surface 204b, forms a surface inclined with respect to the translucent substrate 100. The end surface 204b of the light transmission film 204 is inclined with respect to the surface of the translucent substrate 100 in such a manner that the height thereof from the translucent substrate 100 decreases as the proximity from the display region 13 where the pixels are arranged decreases.

The angle θ formed between end surface 204b of the light transmission film 204 and the translucent substrate 100 is preferably smaller than 20°. For example, the angle θ can be set to 3° to 10°.

Since the thickness of the light transmission film 204 is, for example, 1 μm or more, the step formed by the light transmission film 204 becomes greater in the outer peripheral portion of the pattern of the light transmission film 204. Here, in the outer peripheral portion of the light transmission film 204, the end surface 204b of the light transmission film 204 can be formed as a surface inclined with respect to the translucent substrate 100, and the angle θ formed between the inclined surface and the translucent substrate 100 can be smaller than 20°. This causes disconnection to hardly occur to lines and the like rising from the surface of the translucent substrate 100 onto the light transmission film 204 (in FIG. 10, lines formed with the first conductive films M1). Even in the case of lines formed with second conductive films M2 and third conductive films M3 to be described below, similarly to the lines formed with the first conductive films M1, it is also possible to suppress the disconnection of lines.

Further, the end surface 204b of the light transmission film 204 is covered with the fourth transparent insulating film Cap4, thereby being protected. This makes it possible to suppress the occurrence of cracks in the light transmission film 204 in the manufacturing process.

In particular, in a case where a coating-type material such as a hybrid material obtained by combining an organic material and an inorganic material (for example, SOG) is used as material for the light transmission film 204, cracks tend to occur due to high temperature. For example, when the film thickness of the light transmission film 204 is increased or the annealing temperature is raised, cracks tend to occur in the vicinity of the end of the light transmission film 204 during annealing. This was found by the inventors. Such cracks cause the following risk to increase: the conductive films, that is, metal lines, which get over the step at the end of the light transmission film 204, would become disconnected. To cope with this problem, the end surface 204b of the light transmission film 204 is covered with the fourth transparent insulating film Cap4, whereby the occurrence of cracks can be suppressed.

(Manufacturing Method)

Figure 11:
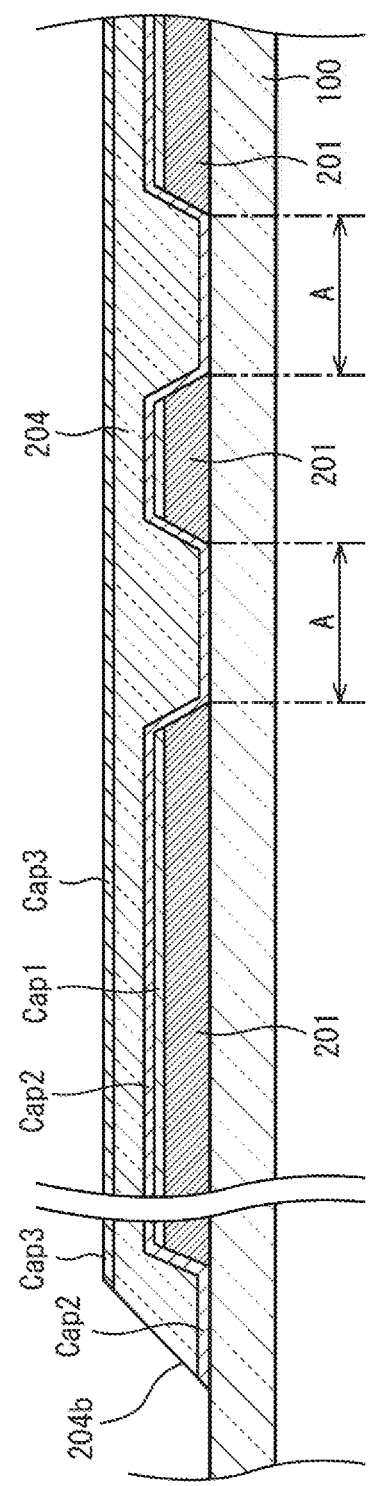
FIG. 11 is an explanatory view illustrating a method for manufacturing the first substrate.

FIGS. 11 to 18 illustrate exemplary process for manufacturing the first substrate 11. FIG. 19 schematically illustrates a flow of the manufacturing process illustrated in FIGS. 11 to 18. First, as illustrated in FIG. 11, the translucent substrate 100 is prepared. An SOG film for forming the light-shielding film 201 is formed on the translucent substrate 100 by spin coating (S1 in FIG. 19). The SOG film can be also formed by slit coating, other than spin coating. The SOG film is fired for about one hour in an atmosphere at 200 to 350° C. (S2 in FIG. 19).

Next, an SiO$_2$ film for forming first transparent insulating film Cap1 is formed by the PECVD method on the translucent substrate 100 so as to cover the light-shielding film 201 (S6 in FIG. 19). The temperature during the film formation can be, for example, 200° C. to 350° C. The obtained SiO$_2$ film can have a thickness of, for example, 50 nm to 200 nm.

The SOG film and the SiO$_2$ film is subjected to a high temperature annealing treatment in a nitrogen atmosphere (84 in FIG. 19). The temperature at which the annealing treatment is performed can be, for example, 400° C. to 500° C. The time while the annealing is performed is, for example, about one to two hours. The annealing treatment may be performed in, for example, a clean dry air (CDA) atmosphere, in place of the nitrogen atmosphere. By preliminarily annealing the SOG film for forming the light-shielding film 201, the occurrence of cracks in the light-shielding film 201 can be suppressed, at the later step of the high temperature annealing in the TFT manufacturing process. Since the SOG film is covered with the SiO$_2$ film, the dark color material such as carbon black is prevented from being oxidized by annealing and becoming transparent.

Thereafter, the SOG film and the SiO$_2$ film are patterned by photolithography (S5 in FIG. 19). With this, as illustrated in FIG. 11, the light-shielding film 201, and the first transparent insulating films Cap1 on the upper surface of the light-shielding film 201 are formed. More specifically, by performing dry etching with use of CF$_4$ gas and O$_2$ gas, the light-shielding film 201 and the first transparent insulating films Cap1 can be formed.

Next, an SiO$_2$ film is formed by the PECVD method so as to cover the first transparent insulating films Cap1 and the light-shielding film 201, on the translucent substrate 100, whereby a second transparent insulating film Cap2 is formed (S6 in FIG. 19). The temperature during the film formation can be, for example, 200° C. to 350° C. The obtained SiO$_2$ film can have a thickness of, for example, 50 nm to 200 nm.

Next, an SOG film for forming the light transmission film 204 is formed on the second transparent insulating film Cap2 by spin coating (S7 in FIG. 19). The SOG film may be also formed by slit coating, other than spin coating. The SOG film has a film thickness of, for example, about 0.5 to 3 μm. The SOG film is fired for about one hour in an atmosphere at 200 to 350° C. (S8 in FIG. 19).

Next, an SiO$_2$ film for forming the third transparent insulating film Cap3 is formed by the PECVD method so as to cover the SOG film (S9 in FIG. 19). The temperature during the film formation can be set to, for example, 200 to 350° C. The SiO$_2$ film can have a thickness of, for example, 50 to 200 nm.

Thereafter, the SOG film and the SiO$_2$ film are patterned by photolithography (S10 in FIG. 19). With this, as illustrated in FIG. 11, the light transmission film 204 and the third transparent insulating film Cap3 on the upper surfaces of the light transmission film 204 are formed. The peripheral portion of the SOG film is removed by this patterning, and the end surface of the light transmission film 204 is formed on the peripheral portion of the first substrate 11. More specifically, the third transparent insulating film Cap3 can be formed by performing dry etching with use of CF$_4$ gas and O$_2$ gas.

In this patterning of the SOG film for forming the light transmission film 204, the light transmission film in the peripheral portion of the display region 13 is removed. Here, a taper shape as illustrated in FIG. 10A, FIG. 10 B and FIG. 11 can be formed at the end of the light transmission film 204 by performing the patterning with use of a gray tone mask or the patterning without use of a mask. In this way, the end surface 204b of the light transmission film 204 is formed into an inclined surface having an angle with respect to the translucent substrate 100. The light transmission film 204, however, may be formed with, for example, a material having photosensitivity. By forming the light transmission film 204 with a material having photosensitivity, the manufacturing steps can be decreased.

Figure 12:
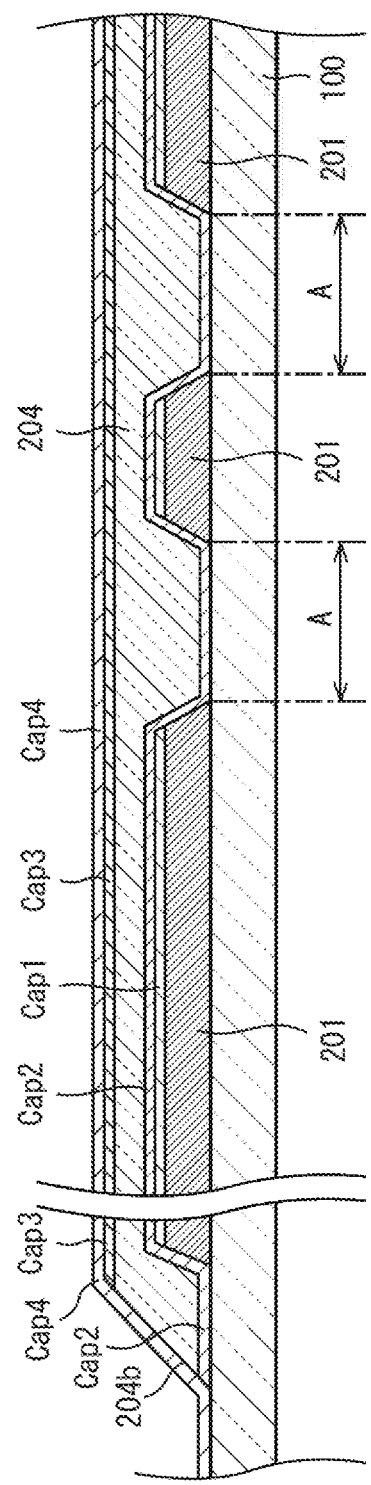
FIG. 12 is an explanatory view illustrating a method for manufacturing the first substrate.

Next, FIG. 12 is referred to. An $SiO_2$ film is formed so as to cover the light transmission film 204 and the third transparent insulating film Cap3 (S11 in FIG. 19). The $SiO_2$ film is patterned so as to remain in an area that overlaps with the light transmission film 204 when viewed in the direction vertical to the translucent substrate 100. With this, the fourth transparent insulating film Cap4 is formed in contact with the end surface 204b of the light transmission film 204 and the upper surface of the third transparent insulating film Cap3.

In the state where the fourth transparent insulating film Cap4 is formed, a high temperature annealing treatment is carried out in a nitrogen atmosphere (S12 in FIG. 19). The temperature at which the annealing treatment is carried out is, for example, 400 to 500° C. The annealing time is, for example, about one hour to two hours. The annealing, however, may be carried out in, for example, a clean dry air (CDA) atmosphere, other than the nitrogen atmosphere. By performing the annealing treatment preliminarily, the occurrence of cracks in the light transmission film 204 in a later high temperature annealing step in the TFT manufacturing process is suppressed.

Regarding the temperatures in the annealing treatments described above, the temperature in the annealing treatment after the fourth transparent insulating film Cap4 is formed (S12 in FIG. 19) can be higher than the temperature in the annealing treatment before forming the fourth transparent insulating film Cap4 (S8 in FIG. 19). With this, it is possible to suppress of the occurrence of cracks from in the light transmission film 204. Further, the temperature of the annealing after the fourth transparent insulating film Cap4 is formed can be at the same level as, or higher than, the treatment temperature in the later step for producing the TFTs 300 (the film forming temperature in CVD or the annealing temperature). By annealing at a temperature at or higher than the temperature in the TFT forming process preliminarily, the occurrence of cracks in the high temperature annealing can be suppressed. After the fourth transparent insulating film Cap4 described above is formed, the end surface 204b of the light transmission film 204 is covered with the fourth transparent insulating film Cap4. Cracks, therefore, hardly occur even with high temperature annealing.

In the TFT process, the highest temperature is at least 400° C. or higher. In this case, the temperature of the annealing after the fourth transparent insulating film Cap4 is formed is set to 400° C. or higher, whereby the occurrence of cracks in the light transmission film 204 in the TFT process can be suppressed.

Figure 13:
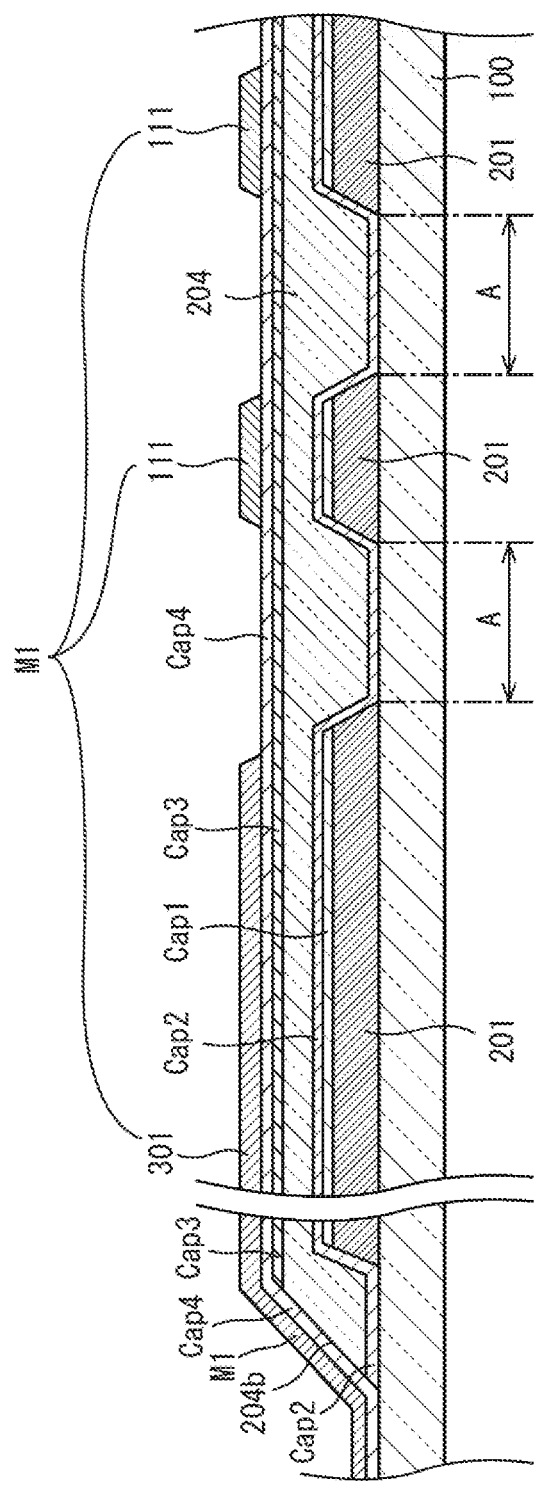
FIG. 13 is an explanatory view illustrating a method for manufacturing the first substrate.

Next, FIG. 13 is referred to. A metal film for forming the first conductive films M1 is formed by sputtering on the fourth transparent insulating film Cap4. The metal film is, for example, a single layer film or a laminate film containing aluminum (Al), tungsten (W), molybdenum (Mo), tantalum (Ta), chromium (Cr), titanium (Ti), copper (Cu), or the like, or any of alloys of at least two of these metals. By patterning the metal film, the first conductive films M1 are formed. The thickness of the first conductive films M1 can be set to, for example, about 50 to 500 nm.

As illustrated in FIG. 13, the first conductive films M1 form the gate electrode 301, the lines 111, lines that are led out of the display region, passing over the end surface 204b of the light transmission film 204, and the like.

Figure 14:
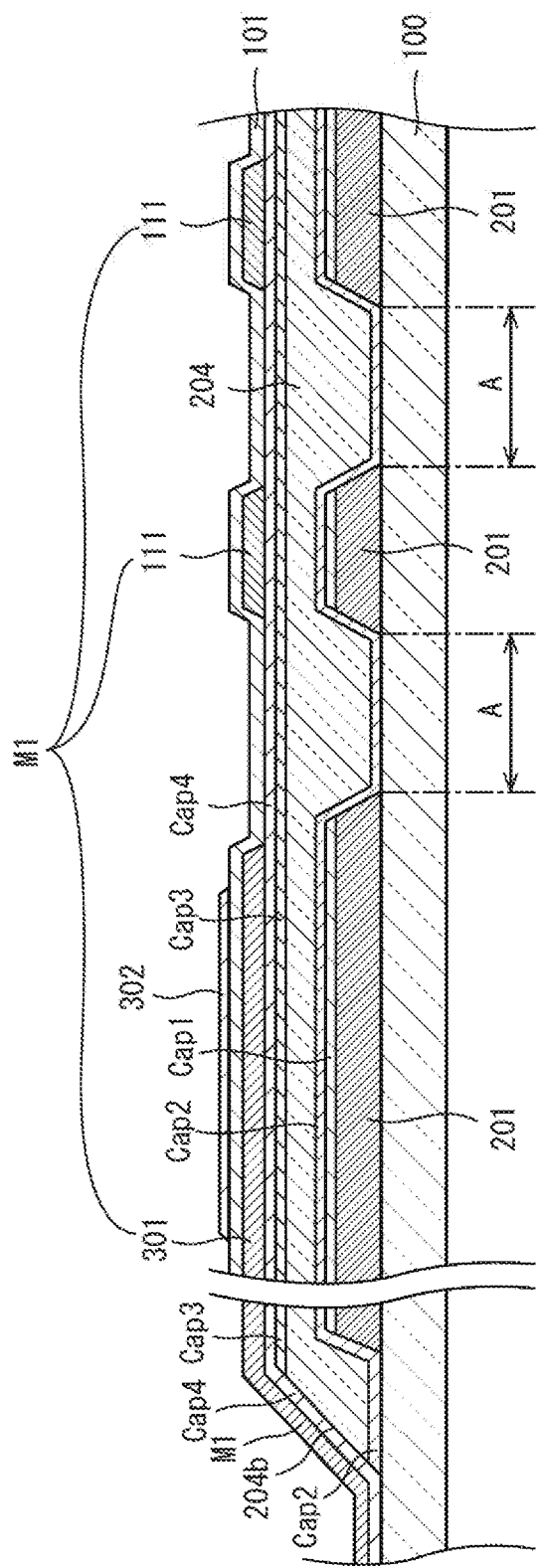
FIG. 14 is an explanatory view illustrating a method for manufacturing the first substrate.

As illustrated in FIG. 14, the gate insulating film 101 is formed so as to cover the first conductive films M1 and the fourth transparent insulating film Cap4. The gate insulating film 101 can be formed by, for example, forming a $SiN_x$ film by the PECVD method. Further, the gate insulating film 101 may be a silicon-based inorganic film containing oxygen (an $SiO_2$ film or the like), or a laminate film composed of an $SiO_2$ film and a $SiN_x$ film. The thickness of the gate insulating film 101 can be set to, for example, 100 to 500 nm.

An oxide semiconductor film for forming the semiconductor film 302 is formed on the gate insulating film 101 by the sputtering method. By patterning the oxide semiconductor film, the semiconductor film 302 is formed in an area corresponding to the TFT 300, that is, an area opposed to the gate electrode 301.

A high temperature annealing treatment is performed to the semiconductor film 302 in a nitrogen atmosphere (S13 in FIG. 19). This allows the transistor properties of the oxide semiconductor to be stabilized. The temperature at which the annealing treatment is carried out is, for example, 400 to 500° C. The annealing time is, for example, about one hour to two hours. The annealing, however, may be performed in, for example, a clean dry air (CDA) atmosphere, instead of a nitrogen atmosphere.

Figure 15:
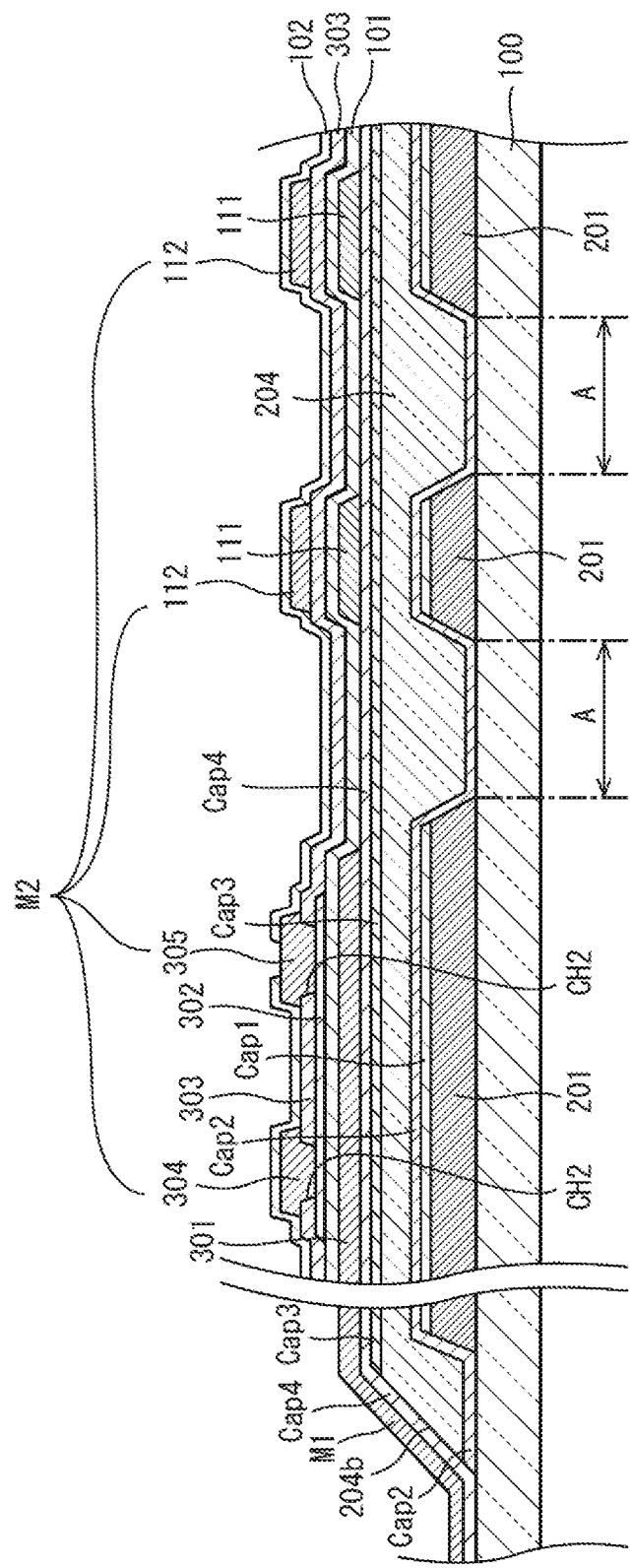
FIG. 15 is an explanatory view illustrating a method for manufacturing the first substrate.

As illustrated in FIG. 15, an $SiO_2$ film is formed by the PECVD method so as to cover the gate insulating film 101 and the semiconductor film 302, whereby the etching stopper layer 303 is formed. The etching stopper layer 303 has a thickness of, for example, 100 to 500 nm. In the etching stopper layer 303, two contact holes CH2 are formed. As illustrated in FIG. 15, the source electrode 304 and the drain electrode 305 reach the semiconductor film 302 through these contact holes CH2.

The source electrode 304 and the drain electrode 305 are formed with the second conductive films M2 provided on the etching stopper layer 303. The second conductive film M2 can be, for example, a single layer film or a laminate film made of aluminum (Al), tungsten (W), molybdenum (Mo), tantalum (Ta), chromium (Cr), titanium (Ti), or copper (Cu), or alternatively, an alloy of at least two of these. The second conductive films M2 are formed by forming a metal film by the sputtering method and patterning the formed film by photolithography. With the second conductive films M2, for example, the source electrode 304, the drain electrode 305, the line 112, a signal line (not shown), and the like can be formed. The thickness of the second conductive film M2 can be set to, for example, 50 to 500 nm.

An $SiO_2$ film is formed by the PECVD method so as to cover the second conductive films M2 and the etching stopper layer 303, whereby the passivation film 102 is formed. The thickness of the passivation film 102 can be set to, for example, 100 to 500 nm.

Figure 16:
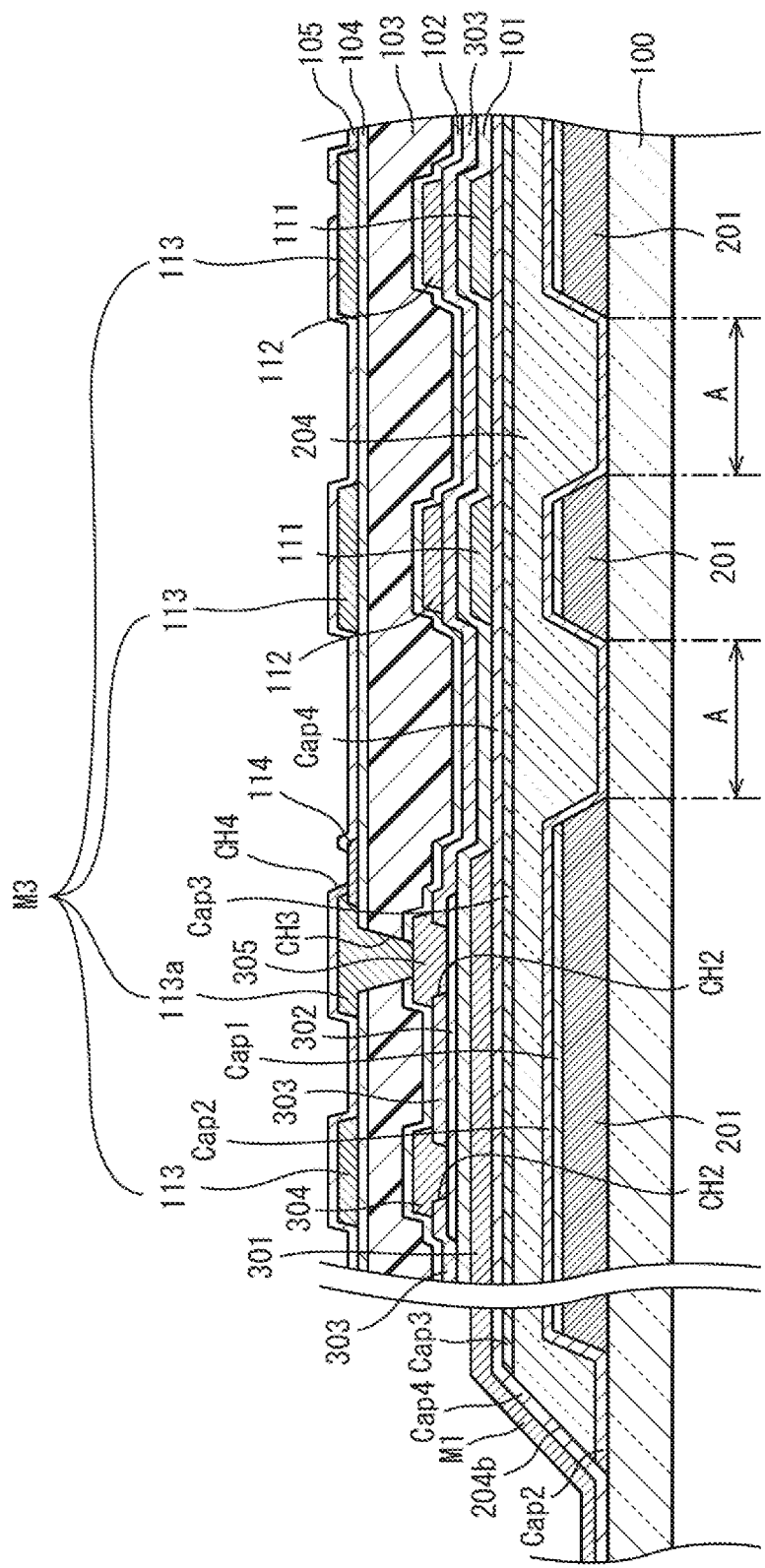
FIG. 16 is an explanatory view illustrating a method for manufacturing the first substrate.

As illustrated in FIG. 16, a photosensitive resin film is formed by the spinning method so as to cover the passivation film 102, whereby the flattening film 103 is formed. The thickness of the flattening film 103 can be set to, for example, 0.5 to 3 μm.

A $SiN_x$ film is formed by the PECVD method so as to cover the flattening film 103, whereby the passivation film 104 is formed. The passivation film 104 has a thickness of, for example, 100 to 500 nm. The passivation film 104, the flattening film 103, and the passivation film 102 are etched, whereby a contact hole CH3 extending from the surface of the passivation film 104 and reaching the drain electrode 305 is formed.

The transparent conductive film 114 is formed by, for example, the sputtering method, on the surface of the passivation film 104, in the vicinity of the contact hole CH3.

Further, the third conductive films M3 for forming the lines 113a, 113 are formed on the passivation film 104. The third conductive film M3 can be, for example, a single layer film or a laminate film containing aluminum (Al), tungsten (W), molybdenum (Mo), tantalum (Ta), chromium (Cr), titanium (Ti), or copper (Cu), or alternatively, an alloy of at least two of these. The third conductive, films M3 are formed by forming a metal film by the sputtering method and patterning the film thus formed by photolithography. The third conductive films M3 form the lines 113, 113a in areas that do not overlap the light-transmitting areas A.

As illustrated in FIG. 16, an $SiN_x$ film is formed by the PECVD method on the passivation film 104 so as to cover the lines 113, the transparent conductive film 114, and the like, whereby the passivation film 105 is formed. The passivation film 105 has a thickness of, for example, 100 to 500 nm. Then, by etching the passivation film 105, a contact hole CH4 extending from the surface of the passivation film 105 and reaching the light transmission film 114 is formed.

Figure 17:
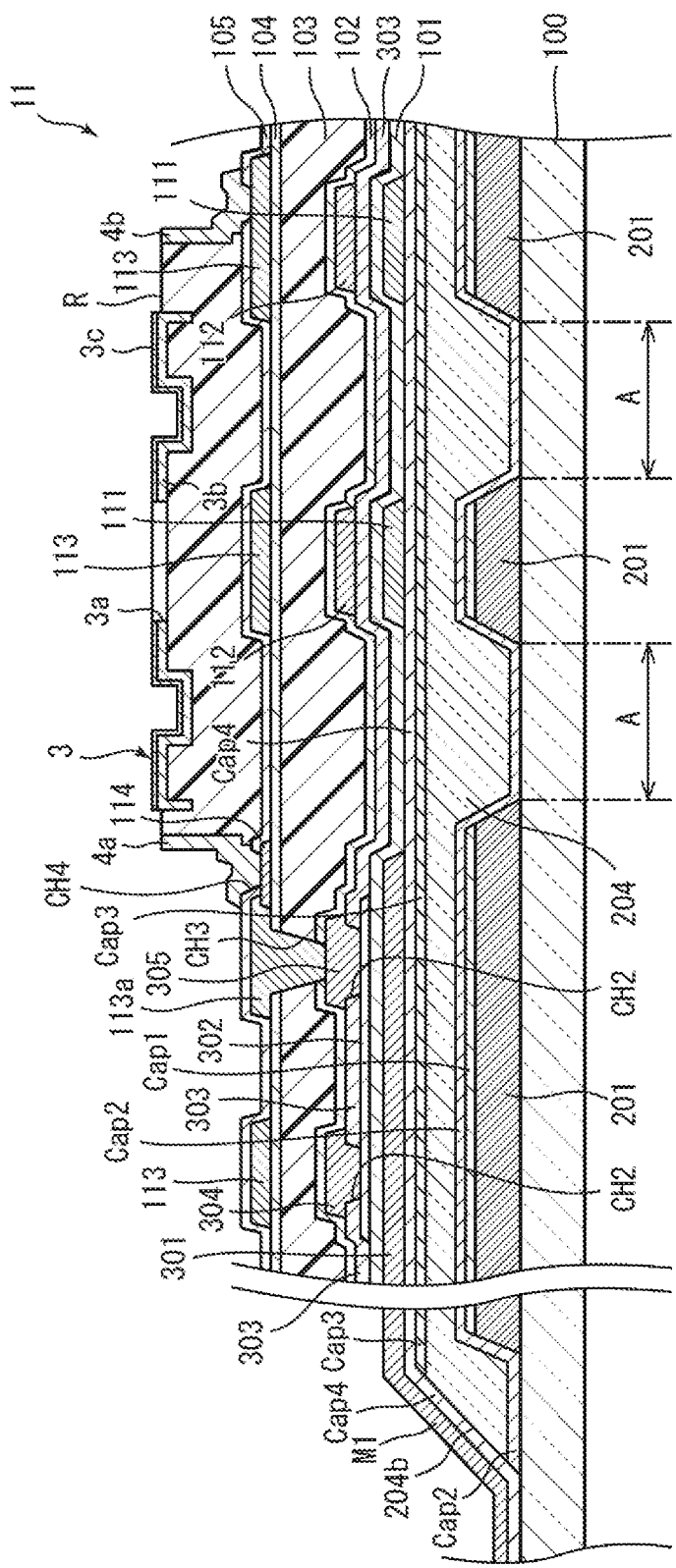
FIG. 17 is an explanatory view illustrating a method for manufacturing the first substrate.

Next, as illustrated in FIG. 17, a resist R is applied to an area including at least the light-transmitting area A, by using, for example, the spin coating method.

Next, an amorphous silicon (a-Si) layer is formed by the PECVD method so as to cover the resist R. Here, a film is formed so as to cover both of the upper surface and the side surface of the resist R. The a-Si layer formed has a thickness of, for example, 200 to 500 nm. Then, the a-Si layer is patterned by photolithography, whereby the first electrode portion 4a, the second electrode portion 4b, the shutter beam 5 (not illustrated in FIG. 17), and the shutter main body 3b are formed. The first electrode portion 4a and the second electrode portion 4b are composed of portions of the a-Si layer formed on a side surface of the resist R.

Subsequently, the metal film 3c is provided on the shutter main body 3b. With this, the shutter body 3 is formed. The metal film 3c can be formed with a metal film that contains any one of, for example, aluminum (Al), tungsten (W), molybdenum (Mo), tantalum (Ta), chromium (Cr), titanium (Ti), copper (Cu), and an alloy of at least two of these metals. The metal film 3c is formed by the sputtering method.

Figure 18:
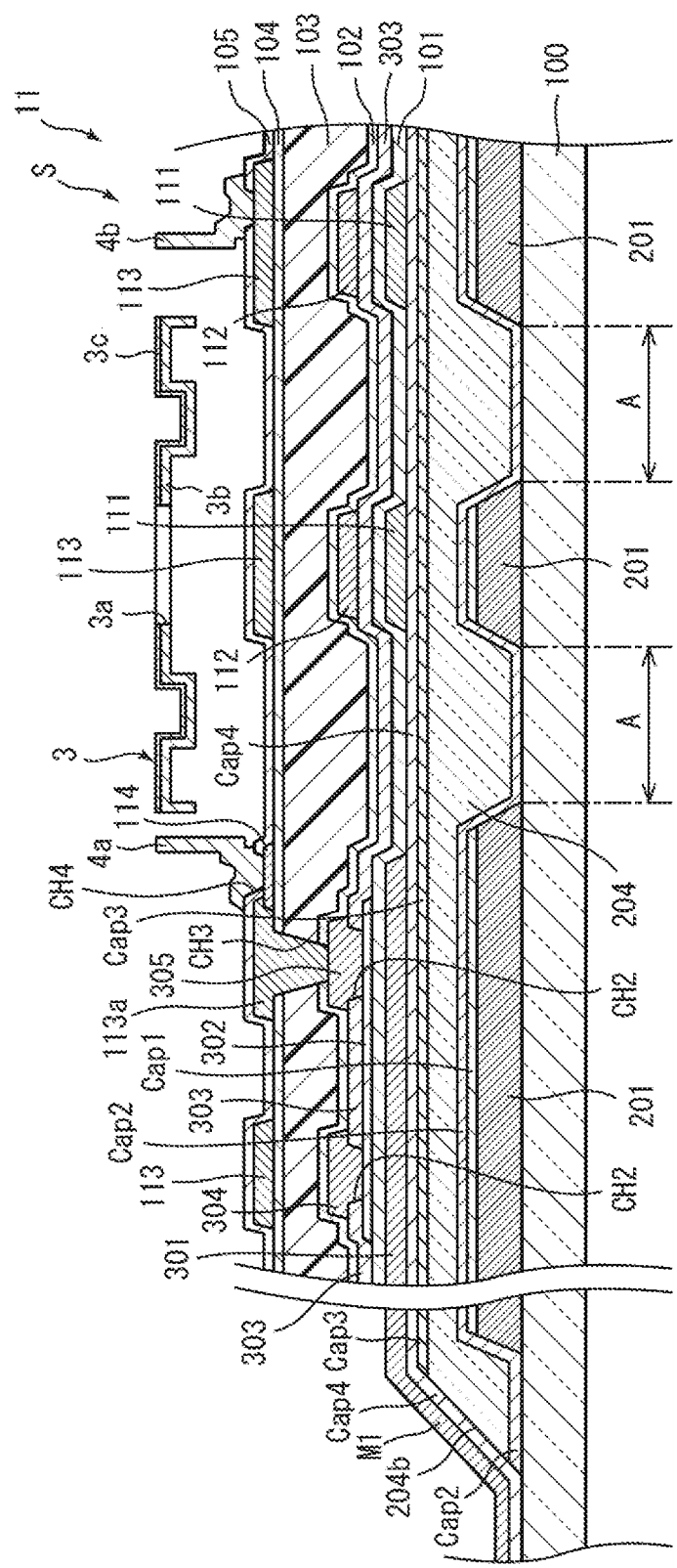
FIG. 18 is an explanatory view illustrating a method for manufacturing the first substrate.
Figure 19:
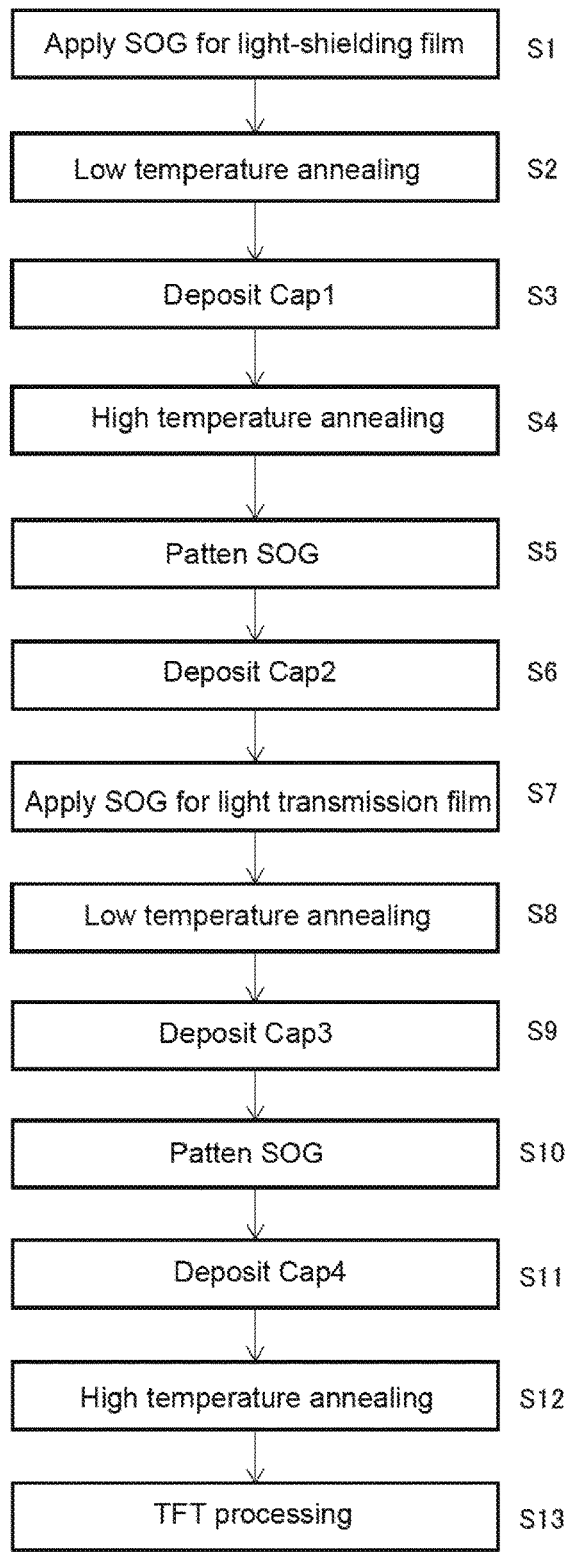
FIG. 19 schematically illustrates a manufacturing flow of the manufacturing method illustrated in FIGS. 11 to 18.

As illustrated in FIG. 18, the resist R is removed by the spinning method. This causes the shutter body 3 to be arranged in a state of being floated from the passivation film 105, with a space therebetween. The shutter body 3 is supported by the shutter beam anchors 8 (not illustrated), via the shutter beams 5 (not illustrated).

Through the above-described steps, the first substrate 11 is produced. In the example illustrated in FIG. 19, an SOG film for the light-shielding film 201 is applied (S1), and, for example, is annealed at a temperature lower than 400° C. (S2). Thereafter, an $SiO_2$ film for forming the first transparent insulating film Cap1 is formed (S3). High temperature annealing is performed, for example, at or above 400° C. (S4) in a state in which the SOG film is covered with the $SiO_2$ film. Thereafter, the two layers, i.e., the SOG film and the $SiO_2$ film are patterned (S5), and an $SiO_2$ film for forming the second transparent insulating film Cap2 is formed thereon (S6).

Further, an SOG film for the light transmission film 204 is applied (S7), and is annealed at a temperature lower than 400° C. (S8). This annealing at S8 is one example of the first annealing step carried out before the fourth transparent insulating film Cap4 (protection film) is formed. On the SOG film, an $SiO_2$ film for forming the third transparent insulating film Cap3 is formed (S9), and thereafter, the SOG film and the $SiO_2$ film are patterned (S10). With this, the light transmission film 204 is formed.

The fourth transparent insulating film Cap4 is formed so as to cover the end surface 204b of the light transmission film 204 (S11), and annealing is executed (S12). The annealing at S12 is performed at or above 400° C. This annealing at S12 is one example of the second annealing step carried out after the fourth transparent insulating film Cap4 (protection film) is formed. Thereafter, at the step of forming the TFTs 300, after the semiconductor film is formed with an oxide semiconductor, again, annealing is performed at or above 400° C. (S13). This annealing at S13 is one example of the third annealing step carried out when the TFTs 300 are formed. In this way, before the high temperature annealing at or above 400° C., the end surface 204b of the light transmission film 204 is covered with the fourth transparent insulating film Cap4, whereby the occurrence of cracks in the vicinity of the end surface 204b can be suppressed effectively. With this, disconnection hardly occurs to the conductive films getting over the end of the light transmission film 204. As a result, the occurrence of line defects decreases. Consequently, the yield increases, and the production costs are reduced.

Embodiment 2

Figure 20:
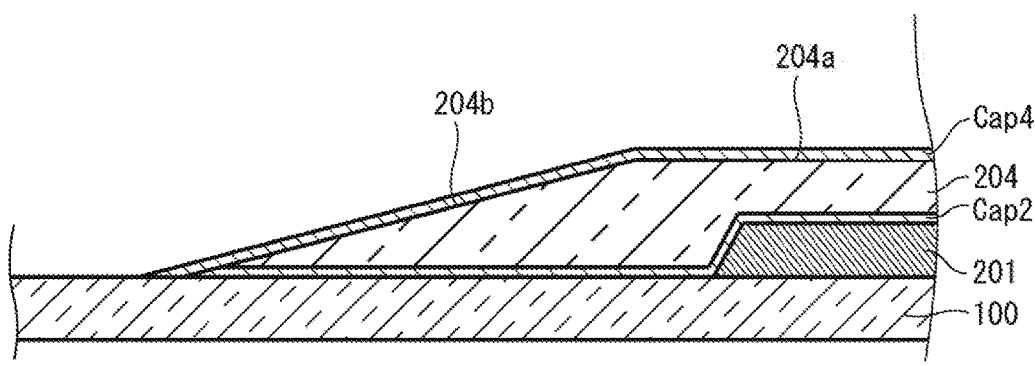
FIG. 20 is a cross-sectional view illustrating a peripheral portion of a light transmission film in Embodiment 2.

FIG. 20 illustrates an exemplary configuration in the vicinity of, an end of a light transmission film 204 in a display device in Embodiment 2. In the example illustrated in FIG. 20, there is no first transparent insulating film Cap1 on the upper surface of the light-shielding film 201. Further, there is no third transparent insulating film Cap3 on the upper surface 204a of the light transmission film 204. In other words, between the light-shielding film 201 and the second transparent insulating film Cap2, no first transparent insulating film Cap1 is provided. Further, between the fourth transparent insulating film Cap4 and the light transmission film 204, no third transparent insulating film Cap3 is provided. Thus, the fourth transparent insulating film Cap4 is provided so as to be in contact with the end surface 204b and the upper surface 204a of the light transmission film 204. The fourth transparent insulating film Cap4 is formed so as to extend from the end surface 204b of the light transmission film 204 toward the upper surface 204a of the same.

In the example illustrated in FIG. 20, the fourth transparent insulating film Cap4 is in contact with the end surface 204b and the upper surface 204a of the light transmission film 204, thereby protecting these. This allows the fourth transparent insulating film Cap4 to protect both of the end surface 204b and the upper surface 204a of the light transmission film 204.

Figure 21:
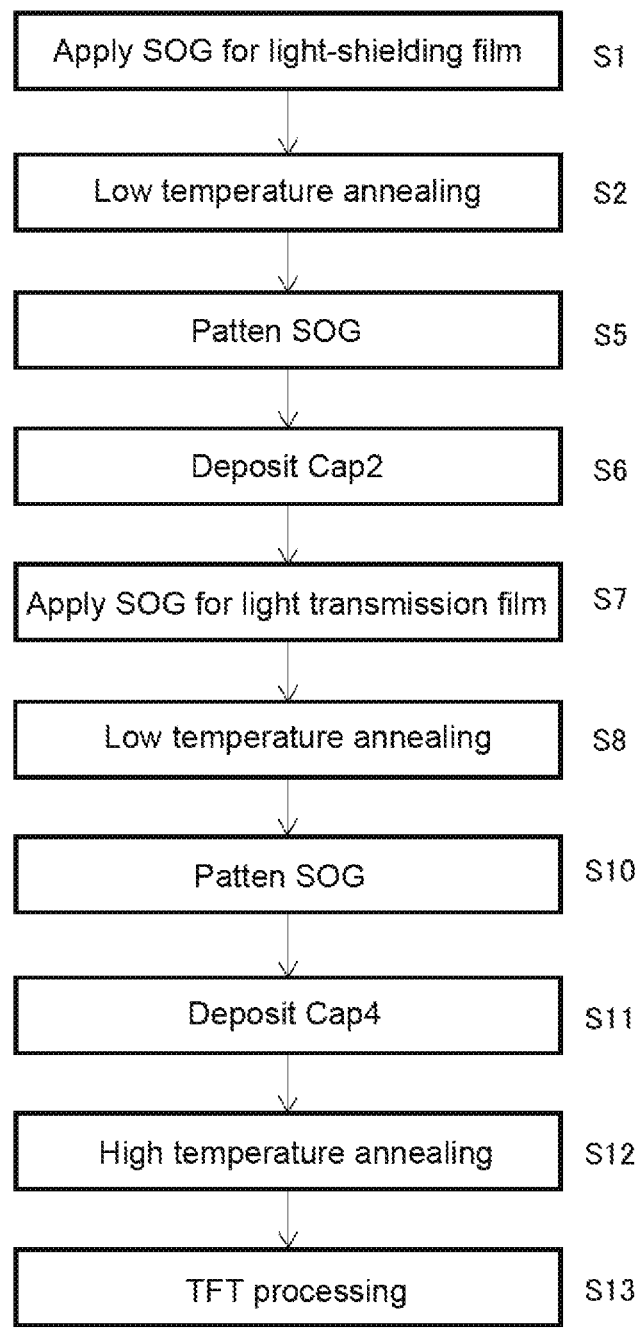
FIG. 21 schematically illustrates a manufacturing flow for manufacturing the display device illustrated in FIG. 20.

FIG. 21 schematically illustrates a manufacturing flow for the process of manufacturing the display device having the configuration illustrated in FIG. 20. In FIG. 20, the same steps as those in FIG. 19 are indicated by the same numbers, respectively. The flow illustrated in FIG. 21 is the flow illustrated in FIG. 19 that do not include the step of forming the first transparent insulating film Cap1 (S3), the subsequent step of high temperature annealing (S4), and the step of forming the third transparent insulating film Cap3 (S9). In this way, in the present embodiment, no other film is interposed between the light-shielding film 201 and the second transparent insulating film Cap2, as well as between the fourth transparent insulating film Cap4 and the light transmission film 204, and accordingly, the film forming steps for these are unnecessary. As a result, the manufacturing process is simplified, which makes it easier to reduce costs.

Embodiment 3

Figure 22:
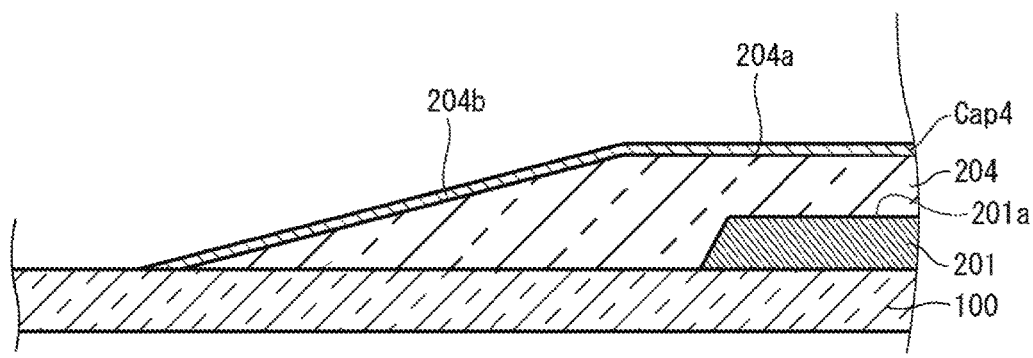
FIG. 22 is a cross-sectional view illustrating a peripheral portion of a light transmission film in Embodiment 3.

FIG. 22 illustrates an exemplary configuration in the vicinity of an end portion of a light transmission film 204 of a display device in Embodiment 3. The configuration illustrated in FIG. 22 is the configuration illustrated in FIG. 20 that does not include the second transparent insulating film Cap2. In other words, no second transparent insulating film Cap2 is provided between the light transmission film 204 and the light-shielding film 201. The light transmission film 204 is therefore provided so as to be in contact with the upper surface 201a of the light-shielding film 201 and the translucent substrate 100.

Figure 23:
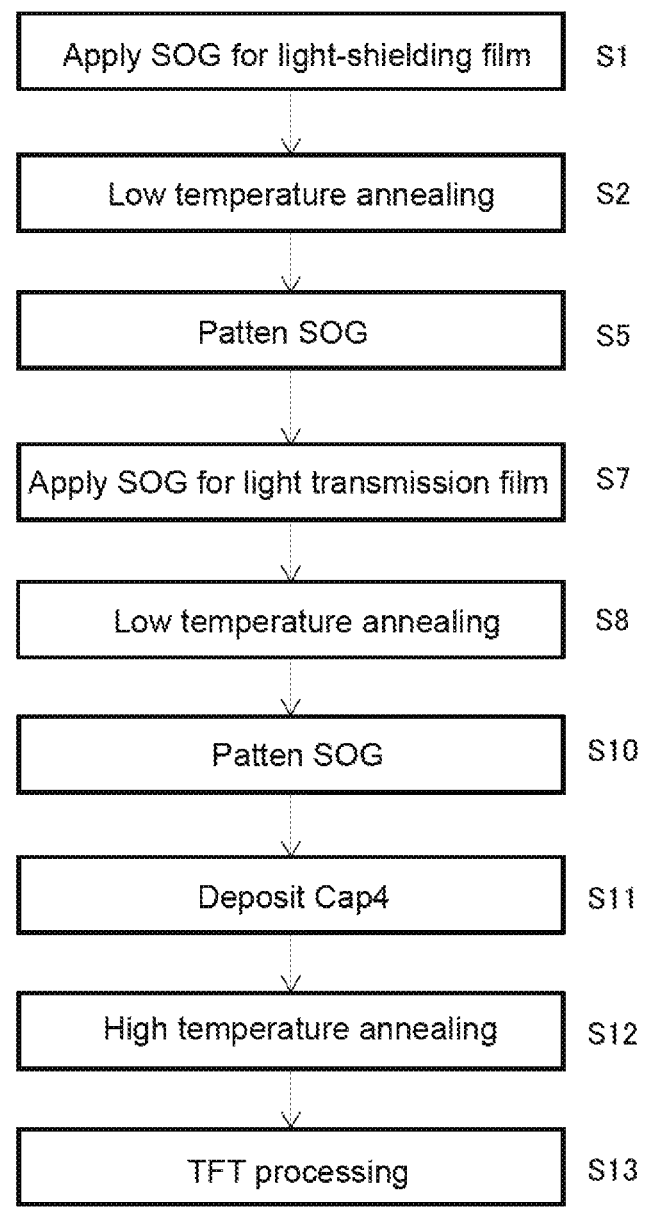
FIG. 23 schematically illustrates a manufacturing flow for manufacturing the display device illustrated in FIG. 22.

FIG. 23 schematically illustrates a manufacturing flow for the process of manufacturing the display device having the configuration illustrated in FIG. 22. In FIG. 23, the same steps as those in FIG. 19 are indicated by the same numbers, respectively. The flow illustrated in FIG. 23 is the flow illustrated in FIG. 19 that does not include the step of forming the first transparent insulating film Cap1 (S3), the subsequent step of high temperature annealing (S4), the step of forming the second transparent insulating film Cap2 (S6), and the step of forming the third transparent insulating film Cap3 (S9). In this way, in the present embodiment, no other film is interposed between the light-shielding film 201 and the light transmission film 204, as well as between the light transmission film 204 and the fourth transparent insulating film Cap4, and accordingly, the film forming steps for these are unnecessary. As a result, the manufacturing process is simplified.

Embodiment 4

Figure 24:
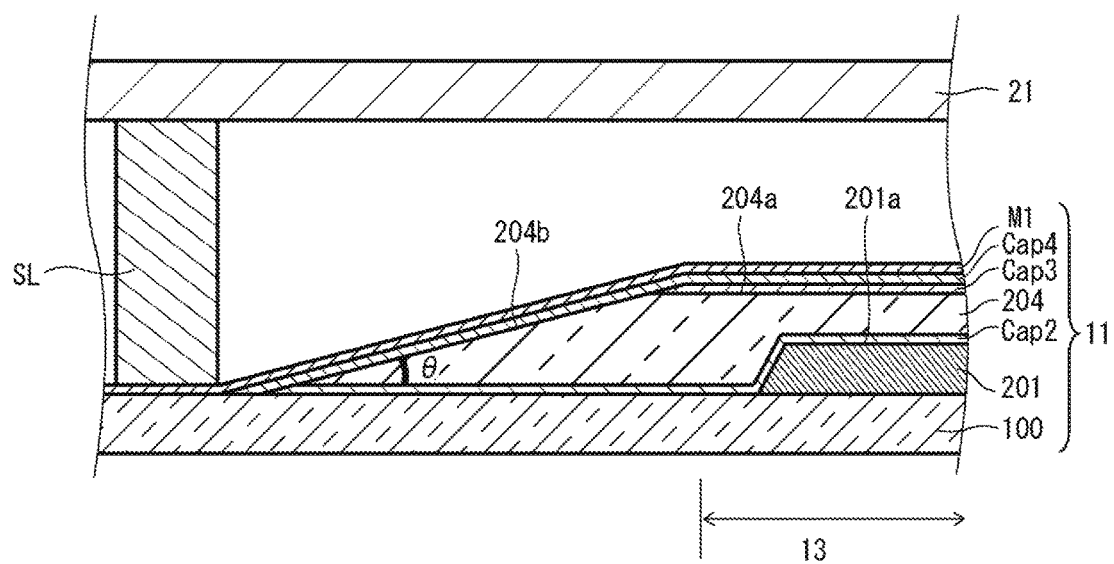
FIG. 24 is a cross-sectional view illustrating a peripheral portion of a light transmission film in Embodiment 4.

FIG. 24 illustrates an exemplary configuration in the vicinity of an end portion of a light transmission film 204 of a display device in Embodiment 4. The example illustrated in FIG. 20 described above has a configuration in which the first transparent insulating film Cap1 and the third transparent insulating film Cap3 are not provided, but the configuration may be such that at least either one of these is not provided. The configuration illustrated in FIG. 24 is the configuration illustrated in FIG. 10A that does not include the first transparent insulating film Cap1. In other words, no first transparent insulating film Cap1 is provided between the light-shielding film 201 and the second transparent insulating film Cap2. The second transparent insulating film Cap2 is therefore is provided so as to be in contact with the upper surface 201a of the light-shielding film 201. The second transparent insulating film Cap2 covers the surface of the substrate 100, as well as the end surface and the upper surface 201a of the light-shielding film 201.

In the case of the configuration illustrated in FIG. 24, the manufacturing flow for the manufacturing process is the flow illustrated in FIG. 19 that does not include the step of forming the first transparent insulating film Cap1 (S3) and the subsequent step of high temperature annealing (S4) (not illustrated). In the present embodiment, no other film is interposed between the light-shielding film 201 and the second transparent insulating film Cap2, and accordingly the film forming steps for these are unnecessary. As a result, the manufacturing process is simplified.

Modification Examples

Embodiments of the present invention are described above, but the present invention is not limited to these embodiments. For example, in the above-described embodiments, the light-shielding film 201 is formed so as to cover the display region 13 other than the light-transmitting area A. For example, the light-shielding film 201 can be arranged so as to be superposed on at least the TFTs 300 when viewed in the direction vertical to the substrate 100. This makes it possible to prevent the TFTs 300 from being exposed to external light that has advanced from the viewing side of the display device 10. Further, the light-shielding film 201 can be arranged so as to be superposed on the data lines 15 and the gate lines 16 as well, in addition to the TFTs 300.

In the above-described embodiments, the light transmission film 204 is provided so as to cover the light-shielding film 201. The light transmission film 204, however, may be provided in the same layer as the light-shielding film 201. For example, the light transmission film 204 may be provided exclusively in areas where the light-shielding film 201 is not provided when viewed in the direction vertical to the transparent substrate 100. Further, in the above-described embodiments, the end surface of the light transmission film 204 is the end surface of the light-shielding layer 200, but the configuration may be such that the end surface of the light-shielding film 201 is the end surface of the light-shielding layer.

In the present embodiment, each of the first transparent insulating film Cap1, the second transparent insulating film Cap2, the third transparent insulating film Cap3, and the fourth transparent insulating film Cap4 may be a silicon-based inorganic film containing oxygen ($SiO_2$ film), may be a silicon nitride film containing nitrogen ($SiN_x$ film), or may be a silicon-based inorganic film containing nitrogen and oxygen (SiON film). Or alternatively, it may be a laminate film of these films. In the description, it is described that the PECVD method is used as the respective methods for forming the first transparent insulating film Cap1, the second transparent insulating film Cap2, the third transparent insulating film Cap3, and the fourth transparent insulating film Cap4, but they may be formed by the sputtering method.

In the description of the present embodiment, it is described that the semiconductor layer 302 of the TFT 300 is made of a compound (In—Ga—Zn—O) containing indium (In), gallium (Ga), zinc (Zn), and, oxygen (O), but the present invention is not limited to this. The semiconductor layer of the TFT 300 may be made of a compound (In-Tin-Zn—O) containing indium (In), tin (Tin), zinc (Zn), and oxygen (O), or alternatively, a compound (In—Al—Zn—O) containing indium (In), aluminum (Al), zinc (Zn), and oxygen (O).

In the above-described embodiments, an oxide semiconductor is used as exemplary semiconductor films of the TFTs. An active matrix substrate that includes TFTs formed with an oxide semiconductor can be applied to, for example, a liquid crystal display that is required to be high-definition, a current-driven organic EL display in which loads on TFTs are large, a MEMS display that is required to operate actions of shutters at a high speed, and the like.

It is possible to apply the configuration of the display device of the present invention and the manufacturing method for the same to an organic electroluminescence display (hereinafter referred to as "organic EL display"). In particular, in a bottom emission type organic EL display, it is useful to form a light-shielding layer on a display viewing side of conductive films, in order to prevent external light advancing from the display viewing side into the display device from being reflected on the conductive films such as the gate electrodes and the like. This light-shielding layer can be formed by the method described in the foregoing descriptions of the embodiments. For example, the light-shielding film can be arranged so as to be superposed on the TFTs respectively corresponding to the pixels when viewed in the direction vertical to the substrate. Further, the light-shielding film may be arranged so as to be superposed on, not only the TFTs, but also the gate lines connected to the TFTs and the gate electrodes.

The configuration of the display device according to the present invention and the method for manufacturing the same can be applied to a liquid crystal display. For example, the configuration of the display device according to the present invention and the method for manufacturing the same can be applied to a see-through-type liquid crystal display that allows an object that is present on the back side thereof to be seen through the liquid crystal display. This is because, in the see-through-type liquid crystal display as well, it is useful to form the light-shielding layer on the display viewing side of conductive films, in order to prevent external light advancing from the display viewing side into the display device from being reflected on the conductive films such as gate electrodes and the like. This light-shielding layer, therefore, can be formed by the method described in the foregoing descriptions of the embodiments. For example, the light-shielding film can be arranged so as to be superposed on TFTs that respectively correspond to pixels when viewed in the direction vertical to the substrate. Further, the light-shielding film may be arranged so as to be superposed on, not only the TFTs, but also the gate lines connected to the TFTs and the gate electrodes. Further, the method for manufacturing the display device according to the present invention can be applied to a liquid crystal display other than the see-through-type liquid crystal display.

Embodiments of the present invention described above are merely examples for implementing the present invention. The present invention is not limited by the embodiments described above at all, and the above-described embodiments can be varied and implemented appropriately without departing from the spirit and scope of the invention.

INDUSTRIAL APPLICABILITY

The present invention is applicable to, for example, a display device.

DESCRIPTION OF REFERENCE NUMERALS

A: light-transmitting area
P: pixel
S: shutter (shutter portion)
100: translucent substrate
200: light-shielding layer
201: light-shielding film
204: light transmission film
300: thin film transistor
303: semiconductor film
Cap1: first transparent insulating film
Cap2: second transparent insulating film
Cap3: third transparent insulating film
Cap4: fourth transparent insulating film (exemplary protection film)

The invention claimed is:
1. An active matrix substrate comprising:
a substrate;
a plurality of data lines;
a plurality of gate lines that extend intersecting with the data lines;
a plurality of pixels provided corresponding to points of intersection between the data lines and the gate lines;
a thin film transistor provided in each of the pixels;
a light transmission film provided between the substrate and the thin film transistors; and
a protection film provided on the light transmission film,
wherein the substrate includes a display region where the pixels are arranged to display an image and a driver region where a driver that provides the pixels with a control signal is arranged, the driver region being arranged outside the display region,
the thin film transistor includes a gate electrode, a gate insulating film, a semiconductor film opposed to the gate electrode with the gate insulating film being interposed therebetween, as well as a drain electrode and a source electrode that are connected to the semiconductor film and are opposed to each other with the semiconductor film being interposed therebetween,
the light transmission film includes an end surface that is positioned outside the display region and inclined to the substrate, and
the protection film is configured to cover the end surface of the light transmission film and is arranged between the light transmission film and the semiconductor film.
2. The active matrix substrate according to claim 1, wherein the end surface of the light transmission film is inclined in such a manner that a height thereof from the substrate decreases as proximity thereof from the display region decreases.
3. The active matrix substrate according to claim 1, further comprising:
a line connected to the thin film transistors,
wherein at least a part of the line is led out onto the protection film covering the end surface of the light transmission film.
4. The active matrix substrate according to claim 1, wherein the light transmission film includes a light-shielding area.
5. The active matrix substrate according to claim 1, wherein the protection film is formed so as to extend from the end surface of the light transmission film to an upper surface of the light transmission film, and to be in contact with the upper surface.
6. The active matrix substrate according to claim 1, further comprising:
a light-shielding film provided between the light transmission film and the substrate,
wherein the light transmission film is provided so as to be in contact with the upper surface of the light-shielding film.
7. The active matrix substrate according to claim 1, wherein the protection film is formed so as to cover the end surface of the light transmission film and the upper surface of the light transmission film,
a transparent insulating film is provided between the protection film and the upper surface of the light transmission film, and a sum of a thickness of the protection film and a thickness of the transparent insulating film is smaller than 200 nm.

8. The active matrix substrate according to claim 1, wherein the light transmission film is formed with an SOG film.

9. The active matrix substrate according to claim 1, wherein the semiconductor film is formed with an oxide semiconductor.

10. A display device comprising the active matrix substrate according to claim 1.

11. The display device according to claim 10, further comprising:
a counter substrate arranged so as to be opposed to the substrate; and
a ring-shaped sealing member for bonding peripheral portions of the substrate and the counter substrate,
wherein the end surface of the light transmission film is arranged on an inner side of the sealing member when viewed in a direction vertical to the substrate.

12. The display device according to claim 10, further comprising:
a shutter portion provided so as to correspond to each of the thin film transistors in a layer above the light transmission film, the shutter portion controlling an amount of light passing through a light-transmitting area, with use of a shutter body controlled by driving of the thin film transistor.

13. The display device according to claim 10, the display device being an organic electroluminescence display.

14. The display device according to claim 10, the display device being a liquid crystal display.

15. The active matrix substrate according to claim 1, a thickness of the light transmission film is greater than a thickness of the protection film.

16. An active matrix substrate comprising:
a substrate;
a plurality of data lines;
a plurality of gate lines that extend intersecting with the data lines
a plurality of pixels provided corresponding to points of intersection between the data lines and the gate lines
a thin film transistor provided in each of the pixels;
a flattening film provided on the substrate; and
a silicon-based inorganic film provided on the flattening film,
wherein the substrate includes a display region where the pixels are arranged to display an image and a driver region where a driver that provides the pixels with a control signal is arranged, the driver region being arranged outside the display region,
the thin film transistor includes a gate electrode, a gate insulating film, and a semiconductor film opposed to the gate electrode with the gate insulating film being interposed therebetween,
the flattening film includes an end surface that is positioned at a periphery end of the display region and inclined to the substrate, and
the silicon-based inorganic film is configured to cover the end surface of the flattening film.

17. The active matrix substrate according to claim 16, further comprising a line that is provided in an upper layer than the silicon-based inorganic film,
wherein the line overlaps with the end surface of the flattening film in a planar view.

18. The active matrix substrate according to claim 16, a thickness of the flattening film is set to 1 µm to 3 µm.

19. The active matrix substrate according to claim 16, the flattening film is selected from the group consisting of a polyimide film and a SOG film.

20. An organic electroluminescence display comprising the active matrix substrate according to claim 16.

* * * * *